(12) United States Patent
Stintz et al.

(10) Patent No.: US 6,816,525 B2
(45) Date of Patent: Nov. 9, 2004

(54) QUANTUM DOT LASERS

(76) Inventors: Andreas Stintz, 4704 Hannett Ave., NE., Albuquerque, NM (US) 87110; Petros M. Varangis, 7817 Pinewood Dr., NW., Albuquerque, NM (US) 87120; Kevin J. Malloy, 7224 General Kearny Ct., NE., Albuquerque, NM (US) 87109-6304; Luke Lester, 8409 Manuel Cia Pl., NE., Albuquerque, NM (US) 87122; Timothy C. Newell, 623 Valencia NE., Albuquerque, NM (US) 87108; Hua Li, 3399 Burgundy Dr., San Jose, CA (US) 95132

( * ) Notice: Subject to any disclaimer, the term of this patent is extended or adjusted under 35 U.S.C. 154(b) by 276 days.

(21) Appl. No.: 09/972,303

(22) Filed: Oct. 5, 2001

(65) Prior Publication Data

US 2002/0114367 A1 Aug. 22, 2002

Related U.S. Application Data

(60) Provisional application No. 60/234,344, filed on Sep. 22, 2000, provisional application No. 60/238,030, filed on Oct. 6, 2000, provisional application No. 60/252,084, filed on Nov. 21, 2000, provisional application No. 60/276,186, filed on Mar. 16, 2001, provisional application No. 60/272,307, filed on Mar. 2, 2001, and provisional application No. 60/316,305, filed on Aug. 31, 2001.

(51) Int. Cl.[7] .............................................. H01S 5/34
(52) U.S. Cl. ....................................................... 372/45
(58) Field of Search ................................... 372/45, 96

(56) References Cited

U.S. PATENT DOCUMENTS

| | | | |
|---|---|---|---|
| 5,541,949 A | 7/1996 | Bhat et al. | |
| 5,543,354 A | 8/1996 | Richard et al. | |
| 5,557,627 A | 9/1996 | Schneider, Jr. et al. | |
| 5,608,229 A | 3/1997 | Mukai et al. | |
| 5,614,435 A | 3/1997 | Petroff et al. | 437/110 |
| 5,710,436 A | 1/1998 | Tanamoto et al. | |
| 5,714,765 A | 2/1998 | Noetzel et al. | |
| 5,781,575 A | 7/1998 | Nilsson | |
| 5,817,538 A | 10/1998 | Mukai et al. | 438/41 |
| 5,881,086 A | 3/1999 | Miyazawa | |
| 5,930,278 A | 7/1999 | Menigaux | |
| 5,953,356 A | 9/1999 | Botez et al. | |
| 6,052,400 A | 4/2000 | Nanbu et al. | 372/50 |
| 6,117,699 A | 9/2000 | Lemoff et al. | |
| 6,177,684 B1 | 1/2001 | Sugiyama | |
| 6,285,704 B1 | 9/2001 | Kullander-Sjoberg et al. | |
| 6,329,668 B1 | 12/2001 | Razeghi | |
| 6,369,403 B1 * | 4/2002 | Holonyak, Jr. | 257/13 |
| 6,583,436 B2 * | 6/2003 | Petroff et al. | 257/18 |
| 6,600,169 B2 * | 7/2003 | Stintz et al. | 257/14 |
| 2002/0022286 A1 * | 2/2002 | Nikolaev et al. | 438/46 |

OTHER PUBLICATIONS

Bloch, J. et al., "Room–temperature 1.3 $\mu$m emission from InAs quantum dots grown by metal organic chemical vapor deposition," *Applied Physics Letters*, American Institute of Physics, New York, U.S., vol. 75, No. 15, Oct. 11, 1999, pp. 2199–2201.

(List continued on next page.)

*Primary Examiner*—James W. Davie
(74) *Attorney, Agent, or Firm*—Fenwick & West LLP

(57) ABSTRACT

A quantum dot active region is disclosed in which quantum dot layers are formed using a self-assembled growth technique. In one embodiment, growth parameters are selected to control the dot density and dot size distribution to achieve desired optical gain spectrum characteristics. In one embodiment, the distribution in dot size and the sequence of optical transition energy values associated with the quantum confined states of the dots are selected to facilitate forming a continuous optical gain spectrum over an extended wavelength range. In another embodiment, the optical gain is selected to increase the saturated ground state gain for wavelengths of 1260 nanometers and greater. In other embodiments, the quantum dots are used as the active region in laser devices, including tunable lasers and monolithic multi-wavelength laser arrays.

16 Claims, 35 Drawing Sheets

OTHER PUBLICATIONS

Evans, P.W. et al., "Edge–emitting quantum well heterostructure laser diodes with auxiliary native–oxide vertical cavity confinement," *Applied Physics Letters*, American Institute of Physics, New York, U.S., vol. 67, No. 21, Nov. 20, 1995, pp. 3168–3170.

Garcia, J.M. et al., "Electronic states tuning of InAs self–assembled quantum dots," *Applied Physics Letters*, American Institute of Physics, New York, U.S., vol. 72, No. 24, Jun. 15, 1998, pp. 3172–3174.

Kim, Jin, K. et al., "Lateral Carrier Confinement in Miniature Lasers Using Quantum Dots," *IEEE Journal of Selected Topics in Quantum Electronics*, IEEE Service Center, U.S., vol. 6, No. 3, May/Jun. 2000, pp. 504–510.

Ledentsov N.N. et al., "Interconnection between gain spectrum and cavity mode in a quantum–dot vertical–cavity laser," *Semiconductor Science and Technology*, Institute of Physics, London, G.B., vol. 14, No. 1, 1999, pp. 99–102.

Park, Gyoungwon et al., "Temperature Dependence of Gain Saturation in Multilevel Quantum Dot Lasers," *IEEE Journal of Quantum Electronics*, IEEE Inc., New York, U.S., vol. 36, No. 9, Sep. 2000, pp. 1065–1071.

Saito, Hideaki et al., "Controlling polarization of quantum–dot surface–emitting lasers by using structurally anisotropic self–assembled dots," *Applied Physics Letters*, American Institute of Physics, New York, U.S., vol. 71, No. 5, Aug. 4, 1997, pp. 590–592.

Schur, Richard et al., "Vertical Microcavity Lasers with InGasAs/GaAs Quantum Dots Formed by Spinodal Phase Separation," *Japanese Journal of Applied Physics*, Tokyo, Japan, vol. 36, No. 3B, Mar. 15, 1997, pp. 357–360.

Shchekin, Oleg B. et al., "Low–Threshold Continuous–Wave Two–Stack Quantum–Dot Laser with Reduced Temperature Sensitivity," *IEEE Photonics Technology Letters*, IEEE Inc., New York, U.S., vol. 12, No. 9, Sep. 2000, pp. 1120–1122.

Uslinov, V.M. et al., "High output power CW operation of a quantum dot laser," *Compound Semiconductors 1999*, Proceedings of the 26th International Symposium on Compound Semiconductors, Berlin, Germany, Aug. 22–26, 1999, Institute of Physics Conference Series, IOP Publishing Ltd., London, G.B., No. 166, pp. 277–280.

PCT International Search Report, International application No. PCT/US01/31256, May 27, 2003, 7 pages.

PCT International Search Report, International application No. PCT/US02/06221, May 27, 2003, 4 pages.

Asryan, L.V.; and Suris, R.A.; *Charge Neutrality Violation In Quantum –Dot Lasers*; IEEE Journal Of Selected Topics In Quantum Electronics; vol. 3, No. 2; Apr. 1997; pp. 148–157.

Bossert, D.J.; and Gallant, D.; *Improved Method For Gain/Index Measurements Of Semiconductor Lasers*; Electronics Letters; vol. 32, No. 4; Feb. 15, 1996; pp. 338–339.

Bossert, David J.; and Gallant, David; Gain, *Refractive Index, And α–Parameter In InGaAs–GaAs SQW Broad–Area Lasers*; IEEE Photonics Technology Letters, vol. 8, No. 3; Mar. 1996; pp. 322–324.

Brandt, O.; Ploog, K.; and Tapfer, L.; *Formation And Morpholoyg Of InAs/GaAs Heterointerfaces*; Physical Review; vol. 45, No. 15; Apr. 15, 1992; pp. 8443–8452.

Brault, J.; Gendry, M.; Grenet, G.; and Hollinger, G.; *Role Of Buffer Surface Morphology And Alloying Effects On The Properties Of InAs Nanostructures Grown On InP(001)*; Applied Physics Letters; vol. 73, No. 20; Nov. 16, 1998; pp. 2932–2934.

Brault, J.; Gendry, M.; Marty, O.; Pitaval, M.; Olivares, J.; Grenet, G.; and Hollinger, G.; *Staggered Vertical Self–Organization Of Stacked InAs/InA1As Quantum Wires On INP(001)*; Applied Surface Science; vol. 162–163; Aug. 2000; pp. 584–589.

Choo, Heung Ro; O, Beom–hoan; Park, Chong Dae; Kim, Hyung Mun; Kim, Jeong Soo; Oh, Dae Kon; Kim, Hong Man; and Pyun, Kwang Eui; *Improvement Of Linewidth Enhancement Factor In 1.55–μm Multiple–Quantum–Well Laser Diodes*; IEEE Photonics Technology Letters; vol. 10, No. 5; May 1998; pp. 645–647.

Chou, S.T.; Hsieh, K.C.; Cheng, K.Y.; and Chou, L.J.; *Growth Of $Ga_xIn_{1-x}As$ Quantum Wire Heterostructures By The Strain–Induced Lateral–Layer Ordering Process*; J. Vac. Sci. Technol. B.; vol. 13, No. 2; Mar./Apr. 195; pp. 650–652.

Chyi, Jen–Inn; Nee, Tzer–En; Lee, Ching–Ting; Shieh, Jia–Lin; and Pan, Jen–Wei; *Formation Of Self–Organized $In_{0.5}Ga_{0.5}As$ Quantum Dosts On GaAs By Molecular Beam Epitaxy*; Journal Of Crystal Growth; vol. 175, 176; 1997; pp. 777–781.

Dutta, N.K.; Hobson, W.S.; Vakhshoori, D.; Han, H.; Freeman, P.N.; de Jong, J.F.; and Lopata, J.; *Strain Compensated InGaAs–GaAsP–InGaP Laser; IEEE Photonics Technology Letters*; vol. 8, No. 7; Jul. 1996; pp. 852–854.

Eliseev, P.G.; Li, H.; Liu, G.T.; Stintz, A.; Newell, T.C.; Lester, L.F.; and Malloy, K.J.; *Gain In Ultra–Low–Threshold InAs/InGaAs Quantum Dot Lasers*; Conference: 2000 IEEE 17th International Semiconductor Laser Conference; Sep. 25–28, 2000; pp. 65–66.

Eliseev, P.G.; Li, H.; Liu, G.T.; Stintz, Andreas; Newell, T.C.; Lester, L.F.; and Malloy, K.J.; *Ground–State Emission And Gain In Ultralow–Threshold InAs–InGaAs Quantum–Dot Lasers*; IEEE Journal On Selected Topics In Quantum Electronics; vol. 7, No. 2; Mar./Apr. 2001; pp. 135–142.

Eliseev, P.G.; Li, H.; Liu, G.T.; Stintz, A.; Newell, T.C.; Lester, L.F.; and Malloy, K.J.; *Optical Gain In InAs/InGaAs Quantum –Dot Structures; Experiments And Theoretical Model*; Quantum Electronics 30 (8); 2000; pp. 664–668.

Eliseev, P.G.; Li, H.; Stintz, A.; Liu, G.T.; Newell, T.C.; Malloy, K.J.; and Lester, L.F.; *Transition Dipole Moment Of InAs/InGaAs Quantum Dots From Experiments On Ultralow–Threshold Laser Diodes*; Applied Physics Letters, vol. 77, No. 2; Jul. 10, 2000; pp. 262–264.

Eliseev, P.G.; Li, H.; Stintz, A.; Liu, G.T.; Newell, T.C.; Malloy, K.J.; and Lester, L.F.; *Tunable Grating–Coupled Laser Oscillation And Spectral Hole Burning In An InAs Quantum–Dot Laser Diode*; IEEE Journal Of Quantum Electronics; vol. 36, No. 4; Apr. 2000; pp. 479–485.

Fiore, A.; Borri; P.; Langbein, W.; Hvam, J.M.; Oesterle, U.; Houdre, R.; and Ilegems, M.; *Time–Resolved Characterization Of InAs/InGaAs Quantum Dot Gain Material For 1.3 μm Laser On Gallium Arsenide*; CLEO 2000 Conference; May 2000; p. 348.

Gingrich, H.S.; Chumney, D.R.; Sun, S.–Z.; Hersee, S.D.; Lester, L.F.; and Brueck, S.R.J.; *Broadly Tunable External Cavity Laser Diodes With Staggered Thickness Multiple Quantum Wells*; IEEE Photonics Technology Letters; vol. 9, No. 2; Feb. 1997; pp. 155–157.

Gonzalez, L.; Garcia, J.M.; Garcia, R.; Briones, F.; Martinez–Pastor, J.; and Ballesteros, C.; *Influence Of Buffer–Layer Surface Morphology On The Self–Organized Growth Of InAs On InP(001) Nanostructures*; Applied Physics Letters; vol. 76, No. 9; Feb. 28, 2000; pp. 1104–1106.

Grundman, M.; and Bimberg, D.; *Theory Of Random Population For Quantum Dots*; Physical Review B; vol. 55, No. 15; Apr. 15, 1997; pp. 9740–9745.

Guo, S.P.; Ohno, H.; Shen, A.; Matsukura, F.; and Ohno, Y.; *InAs Self–Organized Quantum Dashes Grown On GaAs (211)B*; Appl. Phys. Letters, vol. 70, No. 20; May 19, 1997; pp. 2738–2740.

Hakki, Basil W., and Paoli, Thomas L.; *Gain Spectra In GaAs Double–Heterostructure Injection Lasers*; Journal Of Applied Physics, vol. 46, No. 3; Mar. 1975; pp. 1299–1306.

Hinzer, K.; Fafard, S.; SpringThorpe, A.J.; Arlett, J.; Griswold, E.M.; Feng, Y.; and Charbonneau, S.; *Room Temperature Operation Of AlInAs/AlGaAs Quantum Dot Lasers*; Physica E, vol. 2; 1998; pp. 729–733.

Huang, X.; Stingz, A.; Hains, C.P.; Cheng, J.; and Malloy, K.J.; *Efficient High–Temperature CW Operation Of Oxide Confined Long–Wavelength InAs Quantum Dot Lasers*; CLEO 2000 Conference; May 2000; pp. 348–349.

Huang, Xiaodong; Stintz, A.; Hua, Li; Lester, L.F.; Cheng, Julian; and Malloy, K.J.; *Demonstration Of Passive Q–Switching And Passive Mode–Locking In 1.3 μm. Two–Section InAs Quantum Dot Lasers*; Conference: CLEO 2001; May 2001; p. 359.

Huffaker, D.L.; and Deppe, D.G.; *Electroluminescence Efficiency of 1.3 μm Wavelength InGaAs/GaAs Quantum Dots*; Applied Physics Letters; vol. 73, No. 4; Jul. 27, 1998, pp. 520–522.

Kaspi, R.; and Evans, K.R.; *Improved Compositional Abruptness At The InGaAs On GaAs Interface By Presaturation With In During Molecular–Beam Epitaxy*; Appl. Phys. Lett.; vol. 67, No. 6; Aug. 7, 1995; pp. 819–821.

Kirstaedter, N.; Ledenstov, N.N.; Grundmann, M.; Bimberg, D.; Ustinov, V.M.; Ruvimov, S.S.; Maximov, M.V.; Kop'ev, P.S.; Alferov, Zh.I.; Richter, U.; Werner, P.; Gosele, U.; and Heydenreich, J.; *Low Threshold, Large $T_0$ Injection Laser Emission From (InGa)As Quantum Dots*; Electronics Letters, vol. 30, No. 17; Aug. 18, 1994; pp. 1416–1417.

Lester, Luke F.; *Materials Growth And Device Characterization Of InAs Quantum Dot Lasers*; Conference: LEOS; Nov. 15, 2000.

Lester, L.F.; Stintz, A.; Li, H.; Newell, T.C.; Pease, E.A.; Fuchs, B.A.; and Malloy, K.J.; *Optical Characteristics Of 1.24–μm InAs Quantum–Dot Laser Diodes*; IEEE Photonics Technology Letters, vol. 11. No. 8, Aug. 1999; pp. 931–933.

Li, H.; Liu, G.T.; Varangis, P.M.; Newell, T.C.; Stintz, A.; Fuchs, B.; Malloy, K.J.; and Lester, L.F.; *150–nm Tuning In A Grating–Coupled External Cavity Quantum–Dot Laser*; 2000 CLEO Europe Conference; Sep. 2000.

Li, H.; Liu, G.T.; Varangis, P.M.; Newell, T.C.; Stintz, A.; Fuchs, B.; Malloy, K.J.; and Lester, L.F.; *150–nm Tuning Range In A Grating–Coupled External Cavity Quantum–Dot Laser*; IEEE Photonics Technology Letters, vol. 12, No. 7, Jul. 2000; pp. 759–761.

Li, H.; Newell, T.C.; Liu, G.T.; Stintz, A.; Malloy, K.; and Lester, L.F.; *Carrier Lifetime And Radiative Recombination In Quantum Dot LEDs*; IEEE 2000 LEOS Annual Meeting; Nov. 2000; pp. 376–377.

Li, Y.F.; Lin, F.; Xu, B.; Liu, R.Q., Ye, X.L.; Ding, D.; and Wang Z.G.; *Influence Of Growth Conditions On Self–Assembled InAs Nanostructures Grown On (001)InP Substract By Molecular Beam Epitaxy*; Journal of Crystal Growth; vol. 223; 2001; pp. 518–522.

Li, Y.F.; Ye, X.L.; Xu, B.; Liu, F.Q.; Ding, D.; Jiang, W.H.; Sun, Z.Z.; Zhang, Y.C.; Liu, H.Y.; and Wang, Z.G.; *Room Temperature 1.55 μm Emission From InAs Quantum Dots Grown On (001)InP Substrate By Molecular Beam Epitaxy*; Journal Of Crystal Growth; vol. 218; 2000; pp. 451–454.

Li, Yue–Fa; Liu, Feng–Qi; Xu, Bo; Lin, Feng; Wu, Ju; Jiang, Wei–Hong; Ding, Ding; and Wang, Zhan–Guo; *InAs Self–Assembled Nanostructures Grown On InP(001)*; Chinese Physics; vol. 9, No. 3; Mar. 2000; pp. 222–224.

Lian, G.D.; Yuan, J.; Brown, L.M.; Kim, G.H.; and Ritchie, D.A.; *Modification Of InAs Quantum Dot Structure By The Growth Of The Capping Layer*; Applied Physics Letters; vol. 73, No. 1; Jul. 6, 1998; pp. 49–51.

Liu, G.T.; Li, H.; Stintz, A.; Newell, T.C.; Lester, L.F.; and Malloy, K.J.; *Modal Gain And $T_0$ Value Improvements In Quantum Dot Lasers Using Dots–In–A–Well (DWELL) Structure*; IEEE 2000 International Semiconductor Laser Conference; Sep. 2000; pp. 133–134.

Liu, G.T.; Stintz, A.; Li, H.; Lester, L.F.; and Malloy, L.F.; *Ultra–Low Threshold Current Density Quantum Dot Lasers Using The Dots–In–A–Well (DWELL) Structure*; Conference: Physics And Simulation Of Optoelectronic Devices—Conference 8th; Proceedings—SPIE The International Society For Optical Engineering; vol. 3944; 2000; pp. 814–822.

Liu, G.T.; Stintz, A.; Li, H.; Malloy, K.J.; and Lester, L.F.; *Extremely Low Room–Temperature Threshold Current Density Diode Lasers Using InAs Dots In $In_{0.15}Ga_{0.85}As$ Quantum Well*; Electronics Letters; vol. 35, No. 14; Jul. 8, 1999.

Liu, G.T.; Stintz, A.; Li, H.; Malloy, K.J.; and Lester, L.F.; *1.25 μm Low Threshold Current Density Dots–In–A–Well (DWELL) Lasers*; Conference: 1999 Digest Of The LEOS Summer Topical Meetings: Nanostructures And Quantum Dots/WDM Components/VCSELs And Microcavities/RF Photonics For CATV And HFC Systems; Jul. 26–30, 1999.

Liu, G.T.; Stintz, A.; Li, H.; Newell, T.C.; Gray, A.L.; Varangis, P.M.; Malloy, K.J.; and Lester, L.F.; *The Influence Of Quantum–Well Composition On The Performance Of Quantum Dot Lasers Using InAs/InGaAs Dots–In–A–Well (DWELL) Structures*; IEEE Journal Of Quantum Electronics, vol. 36, No. 11; Nov. 2000; pp. 1272–1279.

Liu, G.T.; Stintz, A.; Li, H.; Newell, T.C.; Varangis, P.; Malloy, K.J.; and Lester, L.F.; *One And Three–Stack Quantum Dot Lasers With Very Low Threshold Current Density*; Conference: Conference On Lasers And Electo–Optics (CLEO 2000); May 2000; pp. 346–347.

Liu, G.T.; Stintz, A.; Pease, E.A.; Newell, T.C.; Malloy, K.J.; and Lester; L.F.; *1.58–μm Lattice–Matched And Strained Digital Alloy AlGaInAs–InP Multiple–Quantum–Well Lasers*; IEEE Transactions On Photonics Letters; vol. 12; 2000.

Liu, Guangtian; *Characteristics Of Ultralow Threshold Quantum–Dot Lasers Using InAs/InGaAs Dots–In–A–Well Structures*; Thesis (Ph.D.); University of New Mexico; Dept. of Electrical And Computer Engineering; Dec. 2000; pp. 1–120.

Liu, Guangtian; *Very Low Room–Temperature Threshold Current Density Dots In A Well (DWELL) Lasers*; Conference: 1999 IEEE LEOS Annual Meeting Conference Proceedings. LEOS'99; 12 Annual Meeting; IEEE Lasers And Electro–Optics Society; Nov. 1999; vol. 2; pp. 469–470.

Marciante, John.R.; and Agrawal, Govind P.; *Spatio–Temporal Characteristics Of Filamentation In Broad–Area Semiconductor Lasers*; IEEE Journal Of Quantum Electronics, vol. 33, No. 7; Jul. 1997; pp. 1174–1179.

Maximov, Mikhail V.; Kochnev, Igor V.; Shernyakov, Yuri M.; Zaitsev, Sergei V.; Gordeev, Nikita Yu.; Tsatsul'nikov, Andres F.; Sakharov, Alexey V.; Krestnikov, Igor L.; Kop'ev, Petr S.; Alferov, Zhores I.; Ledentsov, Nikolai N.; Bimberg, Dieter; Kosogov, Alexander O.; Werner, Peter; and Gosele, Ulrigh; *InGaAs/GaAs Quantum Dot Lasers With Ultrahigh Characteristic Temperature ($T_0$=385K) Grown By Metal Organic Chemical Vapour Deposition*; Jpn. J. Appl. Phys.; vol. 36, Pt. 1, No. 6B; 1997; pp. 4221–4223.

Mehuys, D.; Mittelstein, M.: Yariv, A.; Sarfaty, R.; and Ungar, J.E.; *Optimised Fabry–Perot (AlGa)As Quantum–Well Lasers Tunable Over 105nm*; Electronic Letters; vol. 25, No. 2; Jan. 19, 1989, pp. 143–145.

Mirin, R.; Gossard, A.; and Bowers, J.; *Room Temperature Lasing From InGaAs Quantum Dots*; Electronics Letters; vol. 32, No. 18; Aug. 29, 1996; pp. 1732–1734.

Morton, P.A.; Ackerman, D.A.; Shtengel, G.E.; Kazarinov, R.F.; Hybertsen, M.S.; Tanbun–Ek, T.; Logan, R.A.; and Sergent, A.M.; *Gain Characteristics Of 1.55 $\mu m$ High Speed Multiple–Quantum–Well Lasers*; IEEE Photonics Technology Letters, vol. 7, No. 8; Aug. 1995; pp. 833–835.

Mukai, K.; Nakata, Y.; Otsubo, K.; Sugawara, N.; Yokoyama, N.; and Ishikawa, H.; *High Characteristic Temperature Of Near–1.3 $\mu m$ InGaAs/GaAs Quantum–Dot Lasers*; CLEO 2000 Conference; May 2000; pp. 345–346.

Mukai, K.; Nakata, Y.; Shoji, H.; Sugawara, M.; Ohtsubo, K.; Yokoyama, N.; and Ishikawa, H.; *Lasing With Low Threshold Current And High Output Power From Columnar–Shaped InAs/GaAs Quantum Dots*; Electronics Letters; vol. 34, No. 16; Aug. 6, 1998, pp. 1588–1590.

Mukai, Kohki; Ohtsuka, Nobuyuki; Shoji, Hajime; and Sugawara, Mitsuru; *Growth And Optical Evaluation Of InGaAs/GaAs Quantum Dots Self–Formed During Alternate Supply Of Precursors*; Applied Surface Science, vol. 112; Mar. 1997; pp. 102–109.

Mukai, Kohki; Ohtsuka, Nobuyuki; Sugawara, Mitsuru; and Yamazaki; Susumu; *Self–Formed $In_{0.5}Ga_{0.5}As$ Quantum Dots On GaAs Substrates Emitting At 1.3 $\mu m$*; Jpn. J. Appl. Phys. vol. 33, Part 2, No. 12A; Dec. 1, 1994; pp. 1710–1712.

Newell, T.C.; Bossert, D.J.; Stintz, A.; Fuchs, B.; Malloy, K.J.; and Lester, L.F.; *Gain And Linewidth Enhancement Factor In InAs Quantum–Dot Laser Diodes*; IEEE Photonics Technology Letters; vol. 11, No. 12; Dec. 1999; pp. 1527–1529.

Newell, T.C.; Li, H.; Eliseev, P.; Liu, G.T.; Stintz, A.; Malloy, K.J.; and Lester, L.F.; *Broadening Mechanisms, Gain, And Low Linewidth Enhancement Factor In InAs Quantum Dot Lasers*; Conference: CLEO 2000; May 2000; p. 363.

Newell, T.C.; Li, H.; Stintz, A.; Bossert, D.; Fuchs, B.; Malloy, K.J.; and Lester, L.F.; *Optical Characteristics And Low Linewidth Enhancement Factor in 1.2 $\mu m$ Quantum Dot Lasers*; Conference: 1999 IEEE LEOS Annual Meeting Conference Proceedings; LEOS'99; 12th Annual Meeting; IEEE Lasers And Electro–Optics Society 1999 Annual Meeting; Nov. 8–11, 1999.

Newell, T.C.; Varangis, P.M.; Pease, E.; Stintz, A.; Liu, G.T.; Malloy, K.J.; and Lester, L.F.; *High–Power A1GainAs Strained Multiquantum Well Lasers Operating At 1.52 $\mu m$*; Electronics Letters; vol. 36, No. 11; May 25, 2000.

Newell, T.C.; Varangis, P.; Pease, E.; Liu, G.T.; Stintz, A.; Malloy, K.; and Lester L.F.; *1.5 $\mu m$ AlGainAs Quantum Well Lasers Grown By The Ditigal Alloy Technique*; Conference: CLEO 2000; May 2000; pp. 174–175.

Nishi, Kenichi; Saito, Hideaki; and Sugou, Shigeo; *A Narrow Photoluminescence Linewidth of 21 meV at 1.35 $\mu m$ From Strain–Reduced InAs Quantum Dots Covered By $In_{0.2}Ga_{0.8}As$ Grown On GaAs Substrates*; Applied Physics Letters; vol. 74, No. 8; Feb. 22, 1999; pp. 1111–1113.

Park, G.; Shchekin, O.B.; Huffaker, D.L.; and Deppe, D.G.; *Very Low Threshold Oxide–Confined 1.3 $\mu m$ GaAs–Based Quantum Dot Laser*; CLEO 2000 Conference; May 2000; pp. 349–350.

Park, Gyounwon; Shchekin, Oleg B.; Csutak, Sebastian; Huffaker, Diana L.; and Deppe, Dennis G.; *Room–Temperature Continuous–Wave Operation Of A Single–Layered 1.3 $\mu m$ Quantum Dot Laser*; Applied Physics Letters, vol. 75, No. 21; Nov. 22, 1999; pp. 3267–3269.

Prieto, J.A.; Armelles, G.; Priester, C.; Garcia, J.M.; Gonzalez, L.; and Garcia, R.; *Strain–Induced Optical Anisotropy In Self–Organized Quantum Structures At The $E_1$ Transition*; Applied Physics Letters; vol. 76, No. 16; Apr. 17, 2000; pp. 2197–2199.

Qiu, Y.; Gogna, P.; Forouhar, S.; Stintz, A.; and Lester, L.F.; *High–Performance InAs Quantum Dot Lasers Near 1.3 $\mu m$*; Applied Physics Letters; vol. 79, No. 22; Nov. 26, 2001; pp. 3570–3572.

Sakaki, Hiroyuki; *Quantum Wires, Quantum Boxes And Related Structures; Physics, Device Potentials And Structural Requirements*; Surface Science; vol. 267; 1992; pp. 623–629.

Shernyakov, Yu.M.; Bedarev, D.A.; Kondrat'eva, E.Yu.; Kop'ev, P.S.; Kovsh; A.R.; Maleev, N.A.; Maximov, M.V.; Mikhrin, S.S.; Tsatsul'nikov, A.F.; Ustinov, V.M.; Volovik, B.V.; Zhukov, A.E.; Alferov, Zh.I.; Ledentsov, N.N.; and Bimberg, D.; *1.3 $\mu m$ GaAs–Based Laser Using Quantum Dots Obtained By Activated Spinodal Decomposition*; Electronics Letters; vol. 35, No. 11; May 27, 1999; pp. 898–900.

Shoji, H.; Mukai, K.; Ohtsuka, N.; Sugawara, M.; Uchida, T.; and Ishikawa, H.; *Lasing At Three–Dimensionally Quantum–Confined Sublevel Of Self–Organized $In_{0.5}Ga_{0.5}As$ Quantum Dots By Current Injection*; IEEE Photonics Technology Letters, vol. 7, No. 12; Dec. 1995; pp. 1385–1387.

Stintz, A.; Liu, G.T.; Gray, A.L.; Spillers, R.; Delgado, S.M.; and Malloy, K.J.; *Characterization Of InAs Quantum Dots In Strained $In_xGa_{1-x}As$ Quantum Wells*; J.Vac.Sci.Technol.; vol. B 18(3); May/Jun. 2000; pp. 1496–1501.

Stintz, A.; Liu, G.T.; Li, H.; Lester, L.F.; and Malloy, K.J.; *Low–Threshold Current Density 1.3–$\mu m$ InAs Quantum–Dot Lasers With The Dots–In–A–Well (DWELL) Structure*; IEEE Photonics Technology Letters; vol. 12, No. 6; Jun. 2000; pp. 591–593.

Tabuchi, H.; and Ishikawa H.; *External Grating Tunable MQW Laser With Wide Tuning Range Of 240nm*; Electronic Letters; vol. 26, No. 11; May 24, 1990; pp. 742–743.

Thomson, J.D.; Herrmann, E.; Summers, H.D.; Smowton, P.M.; and Hopkinson, M.; *Temperature Insensitive Quantum Dot Structures For Vertical Cavity Lasers*; CLEO 2000 Conference; May 2000; pp. 347–348.

Ustinov, V.M.; Maleev, N.A.; Zhukov, A.E.; Kovsh, A.R.; Egorov, A.Yu.; Lunev, A.V.; Volovik, B.V.; Krestnikov, I.L.; Musikhin, Yu.G.; Bert, N.A.; Kop'ev, P.S.; and Alferov, Zh.I.; *InAs/InGaAs Quantum Dot Structures On GaAs Substrates Emitting at 1.3µm*; Applied Physics Letters; vol. 74, No. 19; May 10, 1999; pp. 2815–2817.

Varangis, P.M.; Li, H.; Liu, G.T.; Newell, T.C.; Stintz; A.; Fuchs, B.; Malloy, K.J.; and Lester, L.F.; *Low–Threshold Quantum Dot Lasers With 201nm Tuning Range*; Electronics Letters; vol. 36, No. 18; Aug. 31, 2000.

Varangis, P.M.; Li, H.; Liu, G.T.; Newell, T.C.; Stintz; A.; Fuchs, B.; Malloy, K.J.; and Lester, L.F.; *183 nm Tuning Range In A Grating–Coupled External–Cavity Quantum Dot Laser*, IEEE 2000 International Semiconductor Laser Conference; Sep. 2000; pp. 137–138.

Wang, R.H.; Stintz, A.; Rotter, T.J.; Malloy, K.J.; and Lester, L.F.; *Low Threshold Oxide–Confined InAs Quantum Dash Ridge Waveguide Lasers On InP Substrates*; Conference: IEEE Lasers & Electro–Optics Society; LEOS Conference; Nov. 12–16, 2001.

Wang, R.H.; Stintz, A.; Varangis, P.M.; Newell, T.C.; Li, H.; Malloy, K.J.; and Lester, L.F.; *Room Temperature Operation Of InAs Quantum–Dash Lasers On InP (001)*; IEEE Photonics Technology Letters; vol. 13, No. 8; Aug. 2001; pp. 767–769.

Wang, Ronghua; Stintz, A.; Varangis, P.M.; Newell, T.C.; Li, H.; Lester, L.F.; and Malloy, K.J.; *1.6 µm Single And Multiple–Stack Room Temperature Quantum Dash Lasers On InP*; Conference: CLEO (Conference On Lasers And Electro Optics)/QELS Plenary Session And Awards Ceremony; May 9, 2001.

Wang, Zhanguo; Liu, Fengqi, Liang, Jiben; and Xu, Bo; *Self–Assembled InAs/GaAs Quantum Dots And Quantum Dot Laser*; Science in China; vol. 43, No. 8; Aug. 2000; pp. 861–870.

Wasilewski, Z.R.; Fafard, S.; and McCaffrey J.P.; *Size And Shape Engineering Of Vertically Stacked Self–Assembled Quantum Dots*; Journal Of Crystal Growth; vol. 201, 202; 1999; pp. 1131–1135 (No Month).

Willatzen, M.; Tanaka, T.; Arakawa, Y.; and Singh, J.; *Polarization Dependence Of Optoelectronic Properties In Quantum Dots And Quantum Wires—Consequences Of Valence–Band Mixing*; IEEE Journal of Quantum Eletronics; vol. 30, No. 3; Mar. 1994; pp. 640–653.

Zhukov, A.E.; Kovsh, A.R.; Egorov, A.Yu.; Maleev, N.A., Ustinov, V.M.; Volovik, B.V.; Maksimov, M.V.; Tsatsul'nikov, A.F.; Ledenstov, N.N.; Shernyakov, Yu.M.; Lunev, A.V., Musikhin, Yu.G.; Bert, N.A.; Kop'ev, P.S.; and Alferov, Zh.I.; *Photo And Electroluminescence In The 1.3 µm Wavelength Range From Quantum–Dot Structures Grown On GaAs Substrates*; Semiconductors; vol. 33, No. 2; Feb. 1999; pp. 153–156.

U.S. patent application Publication, US 2001/0050934, Dec. 13, 2001; Choquette et al.

Komori, Kazuhiro et al., "Noise Study of Low–Dimensional Quantum–Well Semiconductor Laser Amplifiers," *IEEE Journal of Quantum Electronics*, IEEE Inc., New York, US, vol. 28, No. 9, Sep. 1, 1992, pp. 1894–1900.

Saito, Hideaki et al., "Room–temperature lasing operation of a Quantum–dot vertical–cavity surface–emitting laser," *Applied Physics Letters*, American Institute of Physics, New York, US, vol. 69, No. 21, Nov. 18, 1996, pp. 3140–3142.

Utzmeier, T. et al., "Growth and characterization of self–organized InSb quantum dots and quantum dashes," *Journal of Crystal Growth*, North–Holland Publishing Co., Amsterdam, The Netherlands, vol. 175–176, May 1, 1997, pp. 725–729.

PCT International Search Report, International application No. PCT/US01/29561, Jun. 6, 2003, 7 pages.

* cited by examiner

| | |
|---|---|
| p+-GaAs 600 Å | ~ 1455 |
| p-Al$_{0.7}$Ga$_{0.3}$As 2 μm 1E17 cm$^{-3}$ | ~ 1450 |
| undoped GaAs 0.11 μm | ~ 1445 |
| In$_{0.2}$Ga$_{0.8}$As 76 Å | ~ 1440 |
| InAs 1.4 monolayers (dots) | ~ 1430 |
| In$_{0.2}$Ga$_{0.8}$As 20 Å | ~ 1420 |
| InAs 1 monolayer | ~ 1415 |
| undoped GaAs 0.11 μm | ~ 1410 |
| n-Al$_{0.7}$Ga$_{0.3}$As 2 μm 1E17 cm$^{-3}$ | ~ 1405 |
| n-GaAs buffer | ~ 1403 |
| n+-GaAs substrate | ~ 1401 |

FIG. 14A

QUANTUM DOT LASERS

RELATED APPLICATIONS

This application claims priority under 35 U.S.C.§119(e) to the following U.S. Patent Application Nos.: 60/234,344 entitled "Self-Organized Quantum-Dash Growth And Ordered Quantum-Dot Growth and Semi-Conductor Lasers and Transistors Formed From These Structures," filed Sep. 22, 2000; 60/238,030 entitled "Broadband Continuously Tunable-Wavelength Quantum Dot and Quantum Dash Semiconductor Lasers with Low-Threshold Injection Current" filed Oct. 6, 2000; 60/252,084 entitled "Quantum Dot and Quantum Dash Semiconductor Lasers For Wavelength Division Multiplexing (WDM) System Applications" filed Nov. 21, 2000; 60/276,186, entitled "Semiconductor Quantum Dot Laser Active Regions Based On Quantum Dots in a Optimized Strained Quantum Well," filed Mar. 16, 2001; 60/272,307, entitled "Techniques for Using Quantum Dot Active Regions In Vertical Cavity Surface Emitting Lasers," filed Mar. 2, 2001; and 60/316,305, entitled "Quantum Dot And Quantum Dash Active Region Devices," filed Aug. 31, 2001. The contents of all of the above applications are hereby each incorporated by reference in their entirety in the present patent application.

This application is also related to Attorney Docket No. 22920-6391 "Quantum Dash Devices," by Stintz et al., filed in the United States Patent and Trademark Office on Sep. 20, 2001, commonly owned by the assignee of the present patent application, the contents of which are hereby incorporated by reference in their entirety.

The U.S. Government may have certain rights in this invention pursuant to research conducted under the following grants: Grant No. F49620-95-1-0530 awarded by the Air Force Office Of Science and Research, Grant No. DAAL01-96-02-0001 awarded by the Army Research Lab, Grant No. F4920-99-1-330 awarded by the Air Force Office of Science and Research, and Grant No. MDA972-98-1-0002 awarded by the Defense Advanced Research Projects Agency.

BACKGROUND OF THE INVENTION

1. Field of the Invention

The present invention relates generally to self-assembled semiconductor quantum dot lasers. More particularly, the present invention is directed towards quantum dot lasers with improved optical gain characteristics.

2. Description of Background Art

Quantum dot lasers are of interest for a variety of applications. Each quantum dot of a quantum dot laser is a three dimensional quantum-confined heterostructure which confines electrons and holes in a region having a size, along each of three dimensions, that is less than a thermal de Broglie wavelength at room temperature (e.g., less than about 100 nanometers in many applications). The quantum confinement produces quantum confined energy states within each dot for electrons and holes. There are also corresponding optical transition energies for both electrons and holes associated with a ground state transition energy, first excited state transition energy, second excited state transition energy, etc. A quantum dot laser typically includes a substantial total number of quantum dots within a gain producing region.

Theoretical studies indicate that quantum dot lasers have many potential performance advantages over conventional quantum well lasers. First, a quantum dot laser has a lower fill factor (volume of material to be pumped) and an improved density of states function compared with a quantum well laser. Referring to FIG. 1, the theoretical density of states function becomes sharper as the carrier dimensionality decreases. FIG. 1A shows a theoretical density of states function for a bulk material, which has a square root dependence on energy. FIG. 1B shows the theoretical density of states function for a quantum well (one dimension of quantum confinement) that increases in steps at each quantum well energy level. FIG. 1C shows the theoretical density of states function for a quantum wire (two dimensions of quantum confinement). FIG. 1D shows the theoretical density of states function for a quantum dot (three dimensions of quantum confinement) that has a delta-like density of states function (e.g., a finite number of states available only at the quantum dot). Theoretical calculations indicate that the threshold current of a semiconductor laser may be improved by using quantum dot active regions due to the smaller volume of material and reduced number of states.

One technique to fabricate a quantum dot laser exploits the tendency of strained layer semiconductors to form islands when the strain exceeds a certain threshold strain. In particular, InAs tends to form islands when a sufficient thickness of InAs is grown on a layer that is psuedomorphically strained on a GaAs substrate due to strain associated with the difference in relaxed lattice constant of the two materials. The InAs islands may be embedded in another layer, such as a GaAs quantum well, to form quantum dots.

Self-assembled quantum dot lasers having a low threshold current density are disclosed by Lester, et. al. in the article entitled "Optical Characteristics of 1.24-$\mu$m InAs Quantum Dot Laser Diodes," IEEE Photonics Technology Letters, Vol. 11, No. 8, August (1999). The quantum dot laser structure disclosed in this reference includes a single layer of InAs quantum dots formed by a self-assembled growth process on a GaAs substrate. FIG. 2A shows measured laser spectra for different cavity lengths for the quantum dot lasers of Lester, et al. FIG. 2B shows measured current density versus cavity length for conventional Fabry-Perot lasers having uncoated facets.

Referring to FIG. 2B, the lowest threshold current density operation occurs for a cavity length of almost 3.94 millimeters, for which an emission wavelength of 1.24 microns was achieved. The emission wavelength at 1.24 microns is attributed to a ground state transition energy. When the cavity length is reduced to less than about one millimeter, the lasing wavelength blue-shifts to below 1.15 microns, which is attributed to lasing off of the first excited state. When the cavity length is further reduced to about 500 microns, the emission wavelength is further blue shifted to about 1.05 microns.

One drawback of the quantum dot lasers of Lester, et al., is that the maximum wavelength is shorter than desired, particularly for cavity lengths less than one millimeter. In a variety of commercial applications, a wavelength of greater than 1.260 nanometers (1.260 microns) is desired. This is because a wavelength of at least 1260 nanometers is of interest for use in the OC-48 and OC-192 standard compliant lasers used in short and medium length optical network links. OC-48 and OC-192 are optical carrier (OC) standards for fiber optic networks conforming to the SONET standard. OC-48 has a data rate of 2.4888 Gbps whereas OC-192 has a data rate of 9.952 Gbps.

Another drawback of the quantum dot lasers of Lester, et al. is that the modal gain of the ground state is lower than desired, making it impractical to design short-cavity lasers that lase from the ground state transition energy level. The desired laser length depends upon the application. First, many commercially available packages are designed for a cavity length no greater than 500 microns. Second, directly modulated lasers with conventional facet coatings must typically have a cavity length less than 500 microns, and preferably less than about 300 microns, in order to have a photon lifetime that is sufficiently short to permit high speed direct current modulation. The threshold gain, $g_{th}$, of the Fabry-Perot lasers is $g_{th}=\alpha_i-(1/L_{cav})\ln[R]$, where $L_{cav}$ is the length of the cavity, R is the facet reflectivity of both facets, and $\alpha_i$ is the internal optical loss. This corresponds to a minimum modal gain of at least 25 cm$^{-1}$ for a typical 500 micron long cavity with uncoated facets and preferably greater than 40 cm$^{-1}$ for a typical 300 micron long cavity with uncoated facets. Unfortunately, the ground state saturated gain reported by Lester, et. al., is less than 9 cm$^{-1}$. Referring to FIG. 2A, it can be seen that the quantum dot laser structure disclosed by Lester, et al. lases at a wavelength of about 1.05 microns for a cavity length of 500 microns or less, associated with an abrupt jump to lasing at higher excited energy states.

A general problem with self-assembled quantum dot fabrication processes is that heretofore the growth processes have not been understood well enough to adjust quantum dot parameters that determine the optical gain characteristics. Consequently, the optical gain spectrum of self-assembled quantum dot lasers may lack sufficient saturated modal gain at a desired wavelength, have a larger than desired separation between the ground state and excited state transition energies, or have either too little or too much inhomogenous broadening.

What is needed are techniques for forming self-assembled quantum dot active regions having desirable optical gain characteristics.

SUMMARY OF THE INVENTION

Techniques for forming optical devices having layers of quantum dots having desirable optical gain characteristics are disclosed. In one embodiment, the quantum dots are self-assembled InAs quantum dots formed in InGaAs quantum wells that are grown on a GaAs substrate by molecular beam epitaxy. A first barrier layer of AlGaAs or GaAs is grown. A first well layer of InGaAs is grown on the first barrier layer. A sufficient monolayer equivalent thickness of InAs is grown on the InGaAs to form self-assembled islands. A second well layer of InGaAs is grown over the InAs islands to embed the quantum dots. A second AlGaAs or GaAs barrier layer is then grown to complete the quantum well. The optical gain characteristics of the quantum dot layers are influenced by the compositional uniformity of surrounding layers, the dot size distribution, the dot density, and the number of layers of dots that can be placed in an active region without exceeding a critical thickness for forming dislocations.

In one embodiment, the density of dots is adjusted by selecting the composition of the underlying well material that the dots nucleate on and by selecting the growth temperature of the dots. The growth temperature also influences the size distribution of the dots such that in one embodiment the temperature and equivalent monolayer coverage of InAs for the dots is selected to achieve a desired size distribution of the dots. In one embodiment, the well material has an Indium alloy composition of between about $In0_{0.15}Ga_{0.85}As$ to $In_{0.20}Ga_{0.8}As$. In one embodiment the growth temperature of the dots is selected to be in the range of between about 450° C. to 540° C.

In one embodiment, the compositional uniformity of the underlying InGaAs is improved by depositing a floating layer of InAs to pre-saturate the InGaAs, thereby permitting an extremely thin bottom well layer to be grown prior to dot formation. The underlying bottom well layer of InGaAs that the dots nucleate may have a thickness of about two nanometers or less, and in one embodiment has a thickness of about one nanometer.

In one embodiment the spatial uniformity of the dots is improved by performing a desorption process to desorb excess InAs from the top InGaAs well layer that is grown over the dots. The desorption step may be carried out at a temperature of between 560° C. to 650° C. In one embodiment, the desorption process is continued for a sufficient length of time to planarize portions of InAs dots extending above the top InGaAs well layer, thereby improving the uniformity of the InAs dots.

The growth temperature of layers grown subsequent to the quantum dots may be selected to prevent a blue-shift of the emission wavelength of the dots to shorter wavelength. In one embodiment, the growth temperature of cladding layers grown subsequent to the dots is selected to be less than 610° C.

In one embodiment, quantum dot lasers are formed having one or more quantum dot layers. In one embodiment, the growth conditions are selected to achieve a size distribution of the dots that produces substantial inhomogenous broadening of the optical gain spectrum, which is beneficial for tunable laser and arrays of lasers having a wide range of operating wavelength. In another embodiment, the layer structure and growth conditions are selected to achieve a saturated ground state modal gain greater than about 25 cm$^{-1}$.

BRIEF DESCRIPTION OF THE DRAWINGS

FIG. 14A shows a growth sequence for a quantum dot laser.

DETAILED DESCRIPTION OF THE PREFERRED EMBODIMENTS

The present invention is directed towards techniques for fabricating self-assembled layers of quantum dots for optical devices, including techniques for improved control of quantum dot characteristics that determine the optical gain characteristics, including the density of the dots, size distribution of the dots, uniformity of the dots, position of dots within wells, and the strain-thickness product that limits the spacing between neighboring layers of quantum dots. Additionally, laser structures are disclosed having improved optical gain characteristics.

Figure 1A:
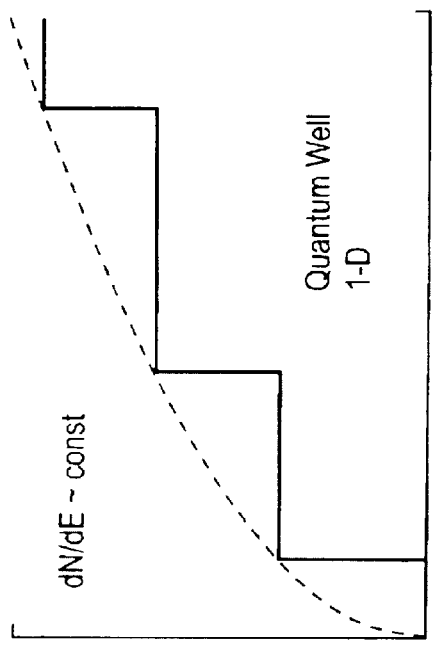
FIGS. 1A, 1B, 1C, and 1D illustrate the density of states function for bulk semiconductors, quantum wells, quantum wires, and quantum dots, respectively.
Figure 1B:
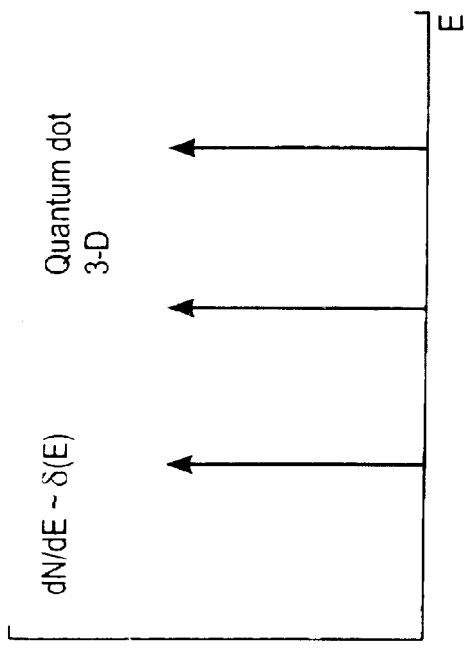
Figure 1C:
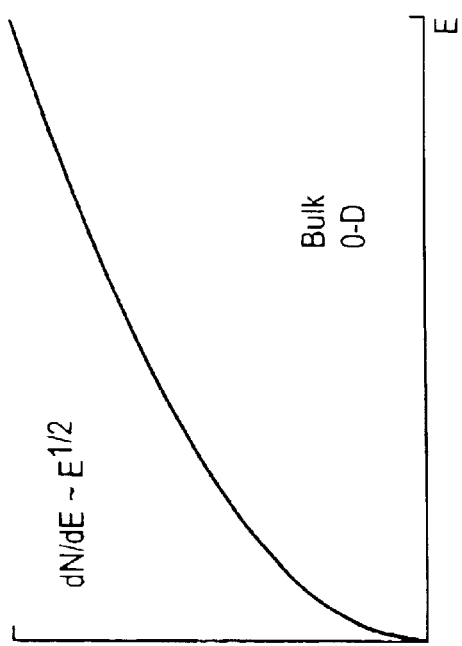
Figure 1D:
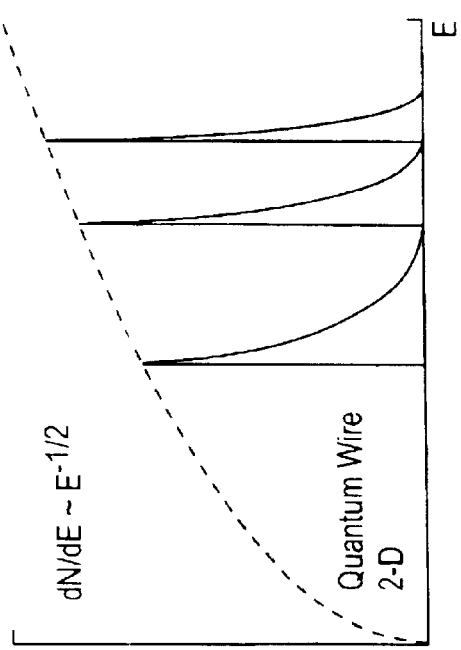
Figure 2A:
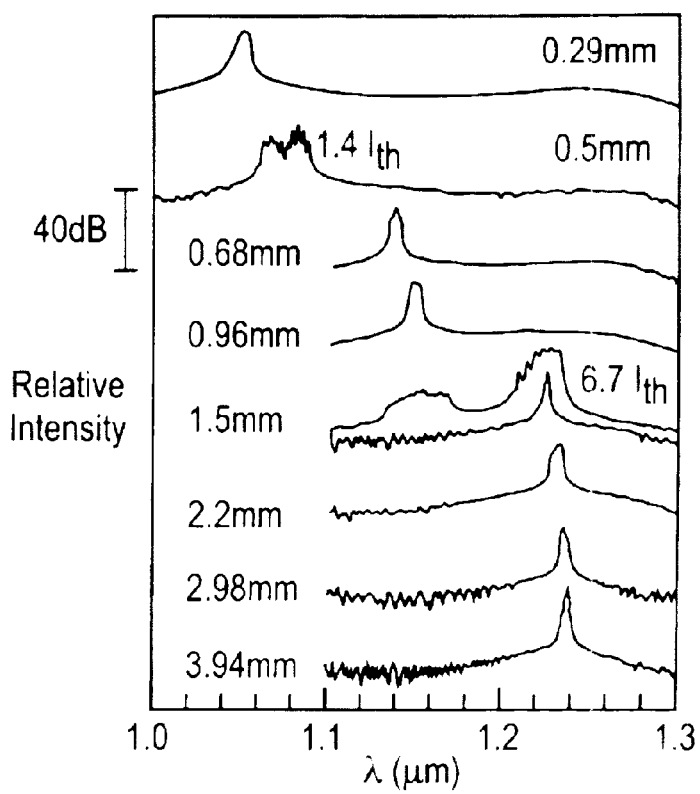
FIG. 2A is a prior art plot showing quantum dot light output intensity versus wavelength for quantum dot lasers of various lengths.
Figure 2B:
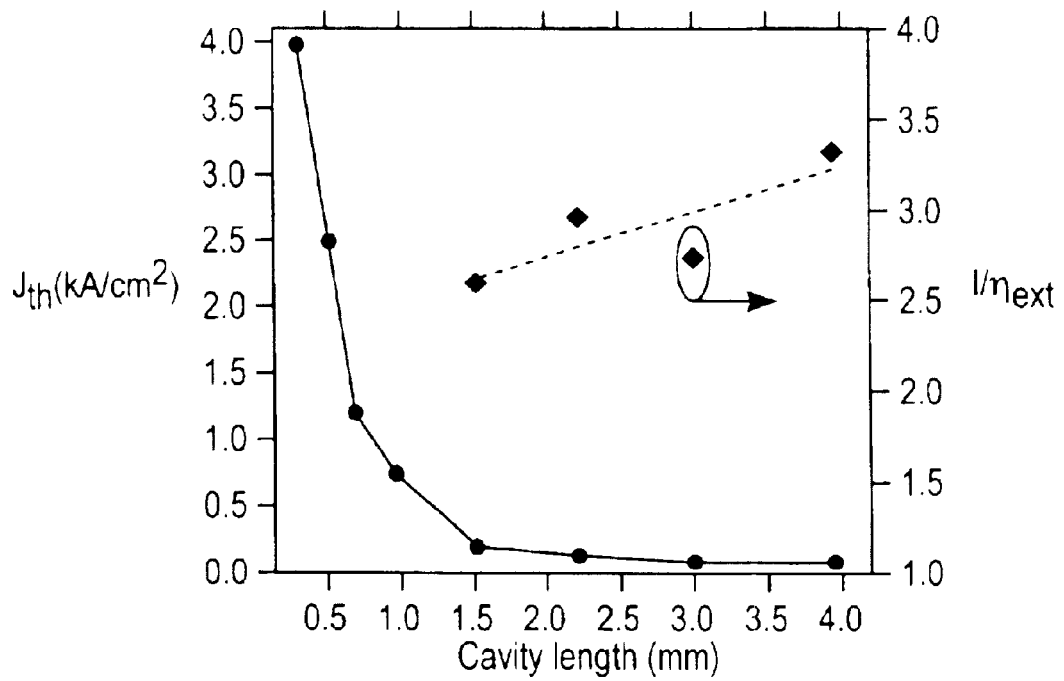
FIG. 2B is a prior art plot showing threshold current versus laser cavity length for the lasers of FIG. 2A.
Figure 3:
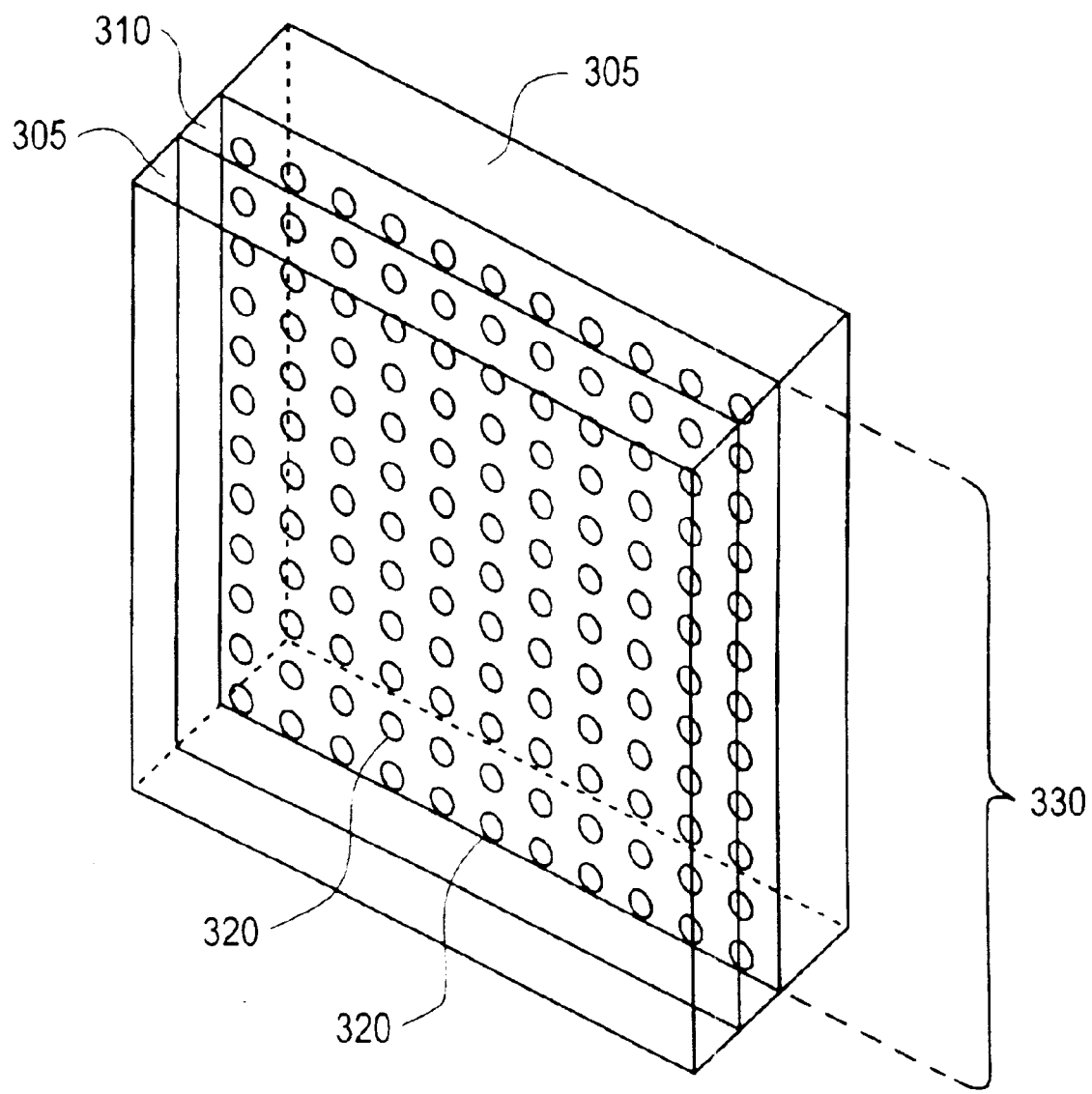
FIG. 3 is a perspective view illustrating an idealized quantum dot layer of quantum dots embedded in a quantum well.

FIG. 3 is a perspective view of an idealized quantum dot layer 330 that includes a multiplicity of individual quantum dots 320 embedded in a quantum well layer 310 sandwiched between barrier layers 305. The individual quantum dots 320 comprise a low bandgap semiconductor material, the quantum well layer 310 comprises a semiconductor with an intermediate bandgap energy, and the barrier layers 305 comprise a high bandgap semiconductor material. The semiconductor materials preferably comprise III–V compound semiconductors.

It will be understood that the quantum dot layer may be included in the active region of a p-i-n laser diode structure that includes an optical waveguide structure to provide optical confinement for light generated in the active region. For example, the laser structure may comprise a bottom optical cladding layer grown having a first doping polarity; a first undoped waveguiding core layer; a quantum dot active region, a second undoped waveguiding core layer, and a top optical cladding layer of a second doping polarity.

The macroscopic optical gain provided by a multiplicity quantum dots 320 will depend upon the optical gain characteristics of the ensemble of quantum dots. The modal gain of an active region including a single quantum dot layer 330 or a sequence of quantum dot layers is the result of the cumulative gain of the ensemble of dots within the active region and the coupling (often known as the "optical confinement" for transverse optical waveguide modes) of light to the quantum dots 320 due to other waveguiding layers (not shown in FIG. 3). The modal gain as a function of wavelength is often described as the "optical gain spectrum."

An individual quantum dot 320 has an optical gain responsive to an injected current associated with optical transitions of its quantum-confined states. A single, ideal quantum dot would have a sharp atomic-like density of states and would have an emission spectrum having sharp peaks at transition energies determined by the size of the dot. Homogeneous broadening occurs due to the effects of injected current, resulting in a broadening of the emission energy from an individual dot by more than 20 meV.

Inhomogeneous broadening of the transition energies of an ensemble of quantum dots occurs due to the influence of dot size. A quantum dot can be modeled as a quantum box having a height, a width, and a length. The height corresponds to the as-grown thickness of the dot. The width and length correspond to the dimensions in the plane of the well. As is well known, to a first order approximation, the first confined quantum states along each dimension of an ideal quantum box have energy levels that vary inversely with the square of the length, i.e. the energy levels, $E_{n1, n2, n3}$, of an ideal quantum box with infinite barriers having a length Lx, a width Ly, and a height Lz is: $E_{n1, n2, n3} = \Delta E_0(n_1^2/Lx^2 + n_2^2/$ $Ly^2+n_3^2/Lz^2$), where $n_1$, $n_2$, and $n_3$ each integers equal to or greater than 1 and $\Delta E_0$ is a material constant. For a quantum box with finite energy barriers, the separation in energy between quantum states tends to vary more slowly due to the penetration of the quantum mechanical wave function into the barrier layers. For an ensemble of dots, the size of each dot varies about a mean value, broadening the quantum confined energy levels for electrons and holes in each dot.

Embodiments of the present invention include growth techniques that permit improved control over the characteristics of individual dots, individual quantum dot layers, and sequences of quantum dot layers. As described below in more detail, these techniques facilitate forming laser structures with desirable optical gain characteristics for various device applications.

Figure 4A:
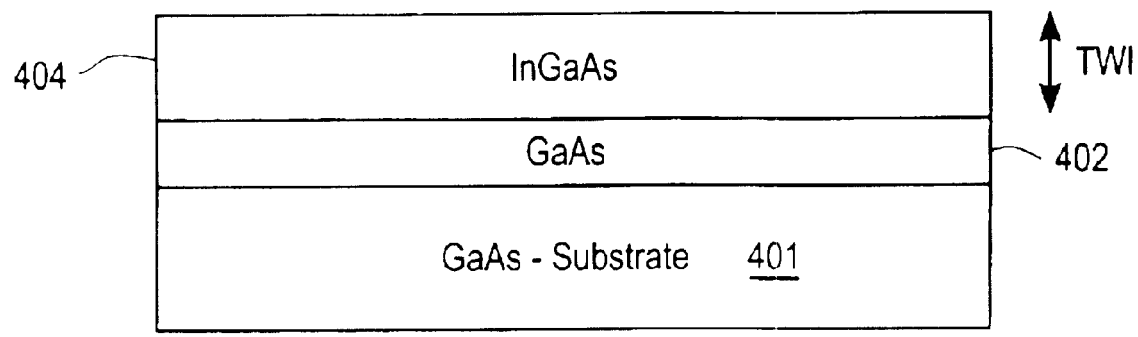
FIGS. 4A–4C each illustrate portions of a growth layer sequence form forming quantum dot layers.
Figure 4B:
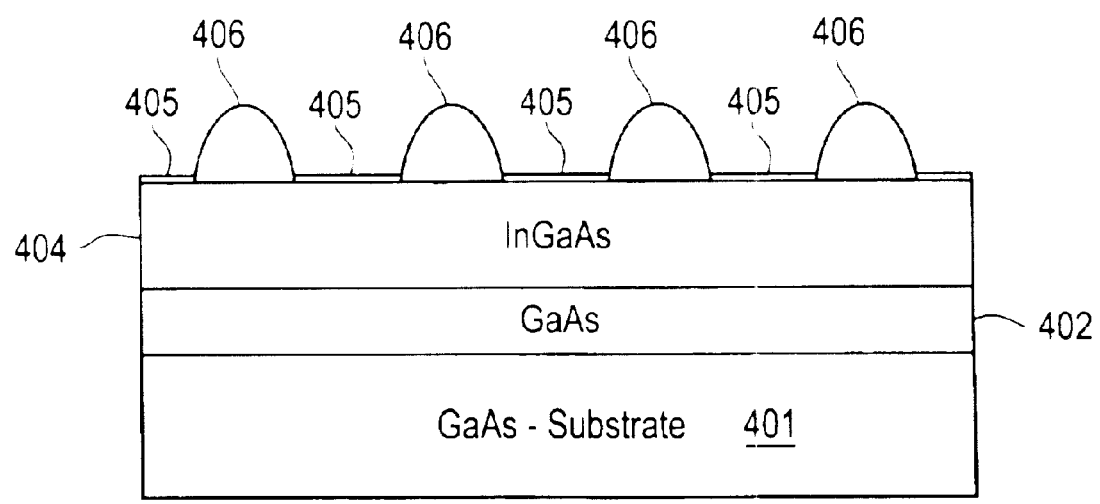
Figure 4C:
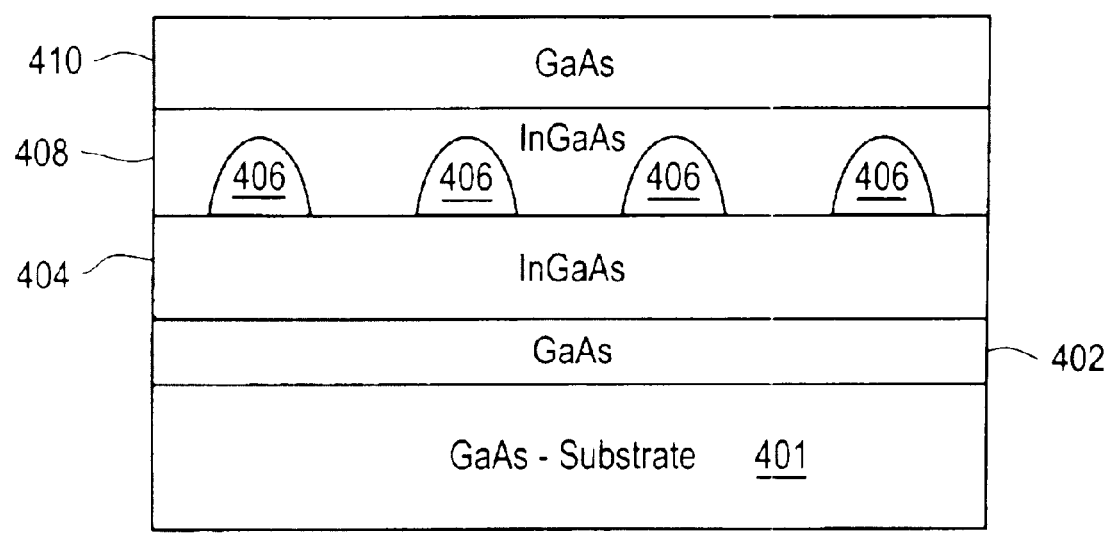

FIGS. 4A–4C are diagrams of growth layer sequences illustrating some of the steps used to form self-assembled quantum dots layers, although it will be understood that additional layers (e.g., waveguiding layers) may be required to form a complete laser or optical amplifier structure. A preferred growth technique is molecular beam epitaxy with the quantum dot layer grown at a temperature between 450° C. to 540° C. A conventional optical pyrometer may be used to determine the temperature. The arsenic flux is preferably chosen to achieve an arsenic stabilized surface. As shown in FIG. 4A, a bottom barrier layer 402 is formed on a substrate 401. In one embodiment the substrate is a GaAs substrate and bottom barrier layer 402 is a layer of GaAs or a layer of AlGaAs.

A bottom well layer 404, preferably comprised of InGaAs, is deposited having a thickness, Tw1. In one embodiment, the thickness of bottom well layer 404 is between about 0.5 to 5 nanometers. In one embodiment, the surface of the bottom barrier layer 402 is pre-saturated with an Indium floating layer of about 0.5 to 1.6 monolayers prior to growth of the bottom InGaAs well layer.

As shown in FIG. 4B, a dot layer, preferably comprised of InAs, is deposited on the bottom well layer 404, forming InAs islands 406. Since the InAs has a relaxed lattice constant that is more than about 2% greater than the underlying semiconductor layers, a Stranski-Krastanow (S-K) growth mode occurs once a sufficient number of equivalent monolayers of InAs is deposited. (As described below in more detail, in one embodiment the equivalent monolayers of deposited InAs include the InAs deposited on the bottom well layer 404 and the InAs monolayer thickness associated with depositing a pre-saturation layer of InAs on bottom barrier layer 402 prior to growth of the bottom well layer 404.) In the S-K growth mode, the driving force for the formation of islands is the reduction in strain energy afforded by elastic deformation, i.e., for S-K growth it is more energetically favorable to increase surface energy by islanding than by relaxing strain by dislocation generation. In a S-K growth mode, the growth becomes three dimensional after a critical thickness of the larger lattice constant material is grown upon an initial wetting layer. Consequently, InAs islands 406 grow on the bottom InGaAs layer 404. Typical ranges of equivalent InAs monolayer coverage for forming islands 404 is between about 1.8 to 4.0 monolayers depending upon other growth parameters and the desired dot size and density. A larger InAs equivalent monolayer coveragage is used for denser and/or larger quantum dots. A thin wetting layer 405 of InAs may remain on the bottom InGaAs well layer 404 for some growth conditions.

A top well layer 408, preferably comprised of InGaAs, is then grown to cap (embed) the InAs islands 404. In one embodiment, the top InGaAs well layer 408 may have a thickness of between four to twelve nanometers. If desired, a growth interruption may be performed after the dot layer to adjust the growth temperature for the top well layer and/or to allow for Ostwald ripening of the dots.

A top barrier layer 410 of GaAs or AlGaAs is then grown to complete the quantum well. In one embodiment, after several monolayers of GaAs are grown in the top barrier layer 410 a growth interruption is performed during which the temperature is raised to between 580° C. to 650° C. to desorb excess Indium floating on the growth surface. The growth temperature of subsequent layers may be selected to preserve the optical quality of the quantum dots.

The bandgap of an InGaAs well is intermediate between that of InAs islands and surrounding GaAs or AlGaAs barrier layers. In one embodiment, the $In_xGa_{1-x}As$ has an alloy fraction of between about 0.1 to 0.3. A high indium alloy fraction has the advantage of increasing carrier confinement to quantum dots but also increases the strain of the layer. Each quantum dot consists of an island of low bandgap material surrounded on all sides by a higher bandgap material. It will be understood that interdiffusion, phase segregation, and spinodal decomposition during the embedding process need to be taken into account because they may affect the shape and composition of the quantum dots.

Figure 5:
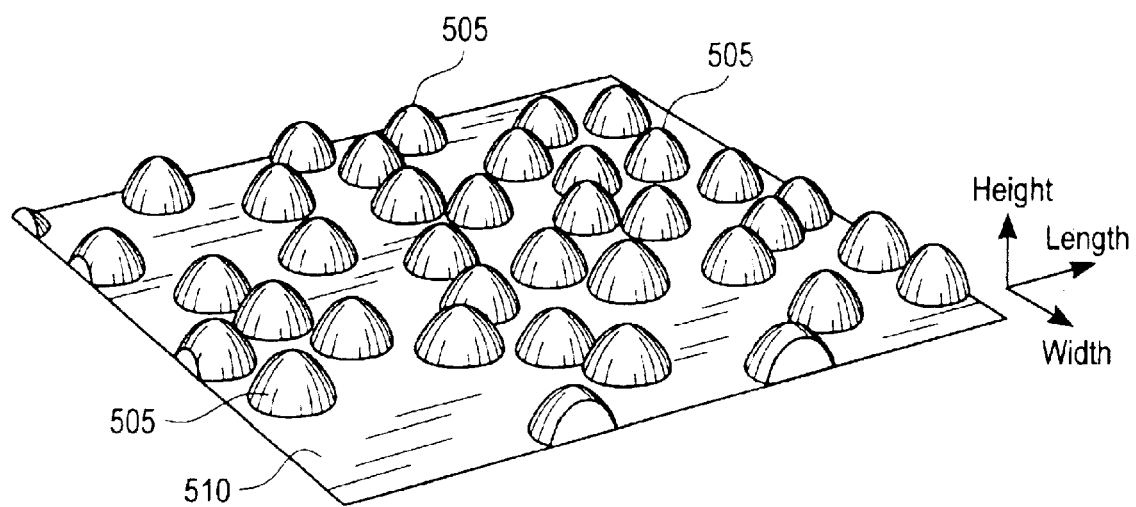
FIG. 5 is an atomic force microscopy image of InAs quantum dots.

The InAs islands that form the core of the quantum dots in grown structures have statistical characteristics that depend upon the growth conditions. FIG. 5 is an atomic force microscopy image showing a perspective view of InAs islands 505 deposited on an InGaAs layer. The islands were grown by molecular beam epitaxy. The dots have a mean diameter of between about 20 to 30 nanometers in the plane of the InGaAs layer and a height (perpendicular to the plane of the InGaAs layer) of about 7 nanometers. The dots have a width-to-length ratio that is typically less than 2:1. It can be seen, however, that the dots have a size distribution such that the dots can be characterized by a mean size and an associated variance. Over a sufficiently large area, the dots in a layer of dots can also be characterized by a dot density (e.g., dots per unit area).

Figure 6:
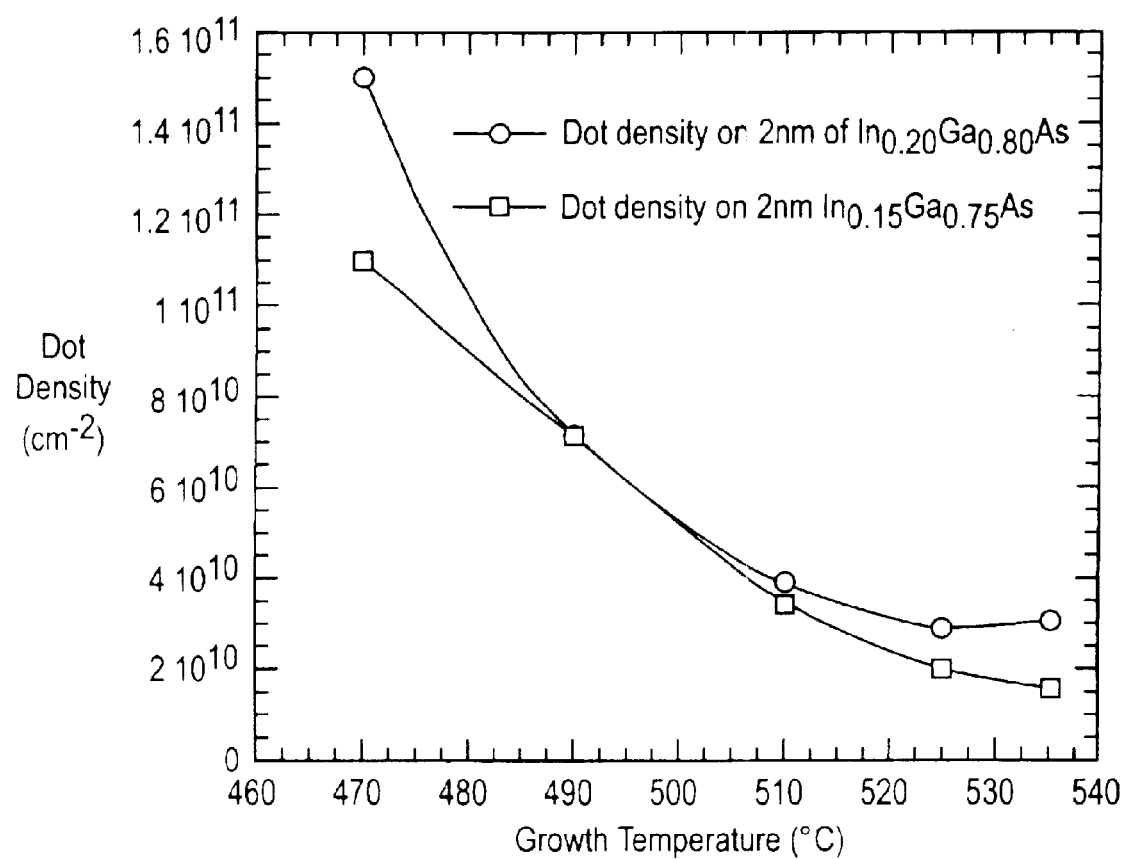
FIG. 6 shows plots of quantum dot density versus growth temperature for two different compositions of a nucleation layer.

FIG. 6 is a plot of quantum dot density versus growth temperature for quantum dots grown on two different InGaAs well layer compositions. It can be seen that the dot density depends strongly upon temperature and also upon the composition of the bottom well layer. Dot densities of greater than $1 \times 10^{11}$ cm$^{-2}$ may be achieved at a growth temperature of about 470° C. The dot density can be adjusted by more than a factor of five by selecting a growth temperature between 470° C. to 540° C. Experiments indicate that the dot density is at least a factor of two higher when the dots are grown on an InGaAs layer compared with a GaAs layer at a comparable temperature. The dot density also increases when the InGaAs alloy composition is increased from $In_{0.1}Ga_{0.9}As$ to $In_{0.2}Ga_{0.8}As$. Experiments by the inventors indicate that the thickness of the bottom InGaAs well layer may be extremely thin and still have the same effect as a thick layer in regards to the nucleation of quantum dots on the bottom InGaAs layer. Thus, to achieve a reproducible dot density, the bottom well layer need only have a thickness consistent with it having a reproducible thickness and alloy composition. The bottom well layer may have a thickness as low as 0.5 nm, although a thickness of about one nanometer may be easier to reproducibly grow.

As can be seen in FIG. 6, there is a strong effect of growth temperature on dot density. Thus, the quantum dot density may be selected over a considerable range by choosing the composition of the bottom InGaAs layer and the growth temperature. Additionally, the dot size increases and the dot density decreases with increased growth temperature. The dots also tend to become more uniform in size with increasing growth temperature. The variance in dot size with growth conditions can be characterized with atomic force microscopy. However, for structures with the dots embedded in a higher bandgap material, the variance in dot size may be inferred from photoluminescence measurements of the full width half maximum (FWHM) for different growth conditions. Generally speaking, a larger variance in quantum dot size tends causes a corresponding increase in photoluminescence FWHM. Thus, for a particular application, a series of quantum dots may be grown under different temperature and the FWHM of photoluminescence used as an indication of the size variation.

Figure 7:
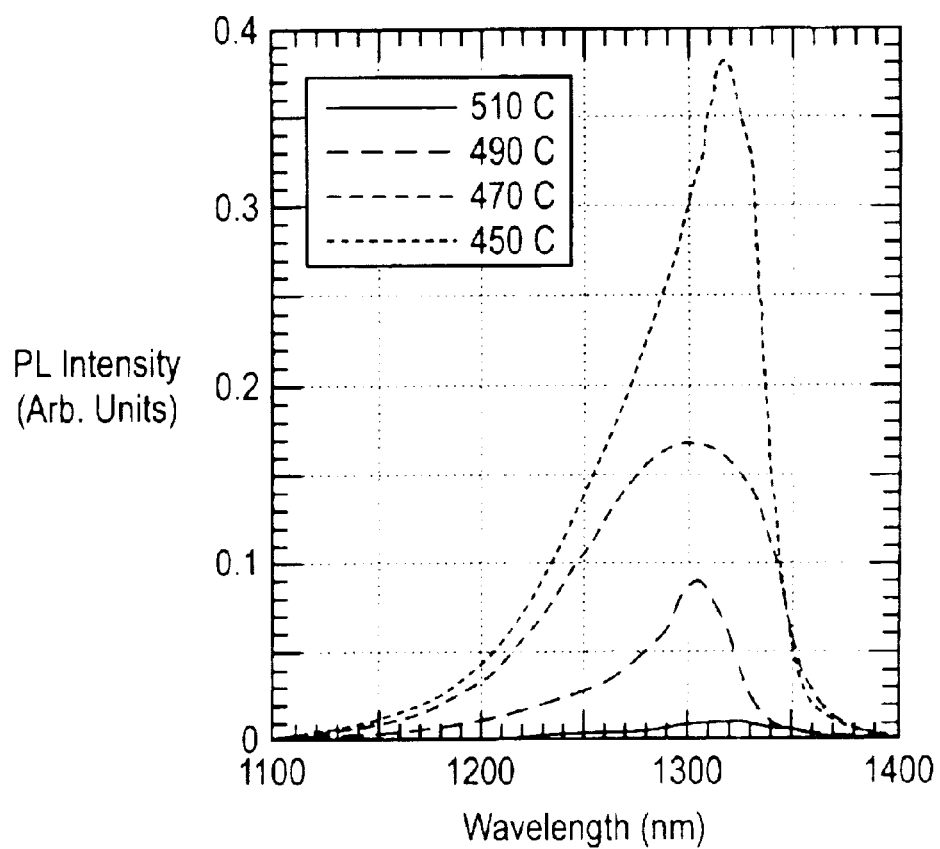
FIG. 7 is a plot showing photoluminescence intensity versus wavelength of quantum dots for several different capping layer growth temperatures.

The growth conditions of layers grown subsequent to the quantum dots influences the optical quality of the quantum dots. In particular, the growth temperature of the top quantum well layer influences the photoluminescence quality of the quantum dots. FIG. 7 shows photolumiscence measurements of InAs quantum dot test structures having upper well InGaAs layers grown at different temperatures. The change in photoluminescence is attributed to decomposition of the upper (capping) well layer at elevated temperatures. Consequently, in one embodiment the growth temperature of the upper well layer is selected to improve the optical quality of the quantum dot layer. In one embodiment of a laser, the growth temperature of the upper well layer is selected to be between about 460° C. to 490° C., since this temperature range facilitates achieving a combination of both good material quality and a ground state transition energy corresponding to a comparatively long emission wavelength.

Figure 8:
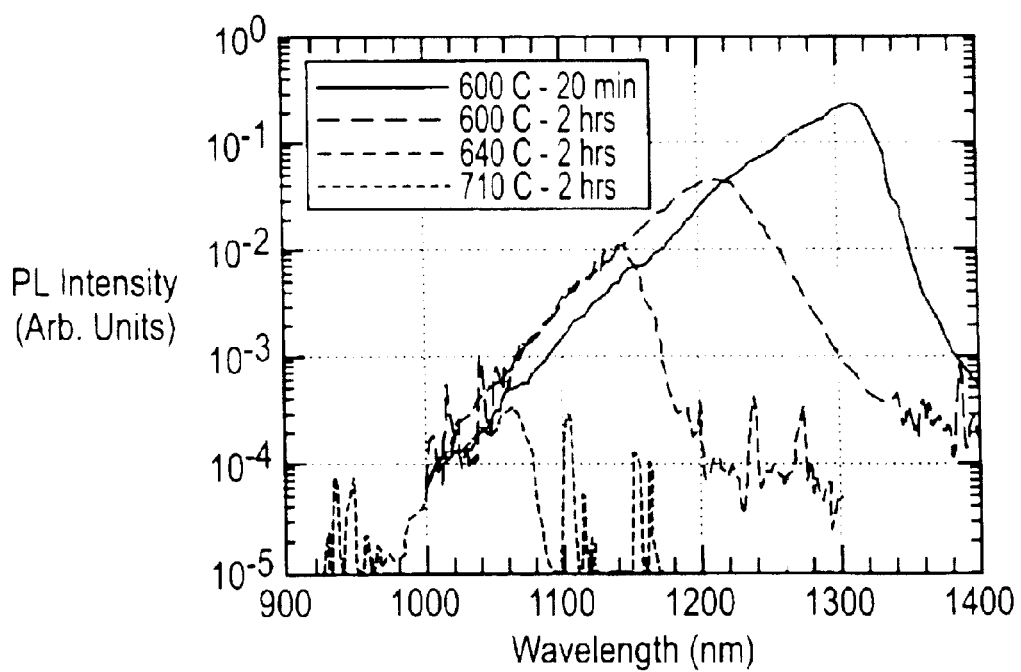
FIG. 8 shows plots of photoluminescence intensity versus wavelength of quantum dots for several different annealing temperatures and times.

The growth of thick layers subsequent to the quantum dot layers may also influence the optical characteristics of the quantum dots. FIG. 8 shows photoluminescence spectra for quantum dot test structures annealed at different temperatures to simulate the growth of waveguide cladding layers in a laser structure. A considerable blue-shift (shift to shorter wavelengths) occurs for high annealing temperatures. This indicates that for a long wavelength laser (e.g., one having a wavelength beyond 1.24 microns) it is desirable to select a comparatively low growth temperature of cladding layers grown subsequent to the quantum dot layers (e.g., a growth temperature of AlGaAs cladding layers of less than about 610° C.).

Figure 9:
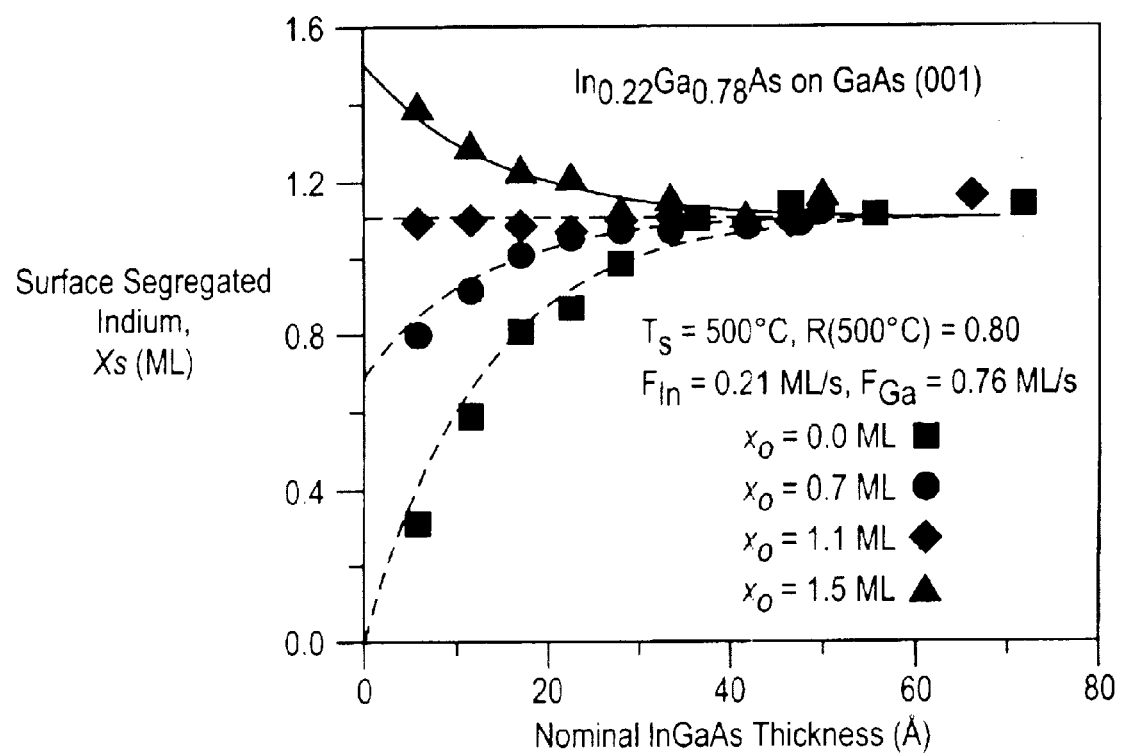
FIG. 9 is a prior art plot of the surface segregated indium coverage for different nominal InGaAs growth thicknesses.

It is desirable that the surface of the InGaAs semiconductor comprising bottom layer 404 have a reproducible InGaAs alloy compositon. This is, in part, due to the strong dependence of dot density on the InGaAs alloy composition of bottom layer 404, as shown in FIG. 6. However, it is known in the art of field effect transistors that when an InGaAs is grown on top of a layer that does not include indium, such as GaAs or AlGaAs, that the InGaAs may have a graded alloy composition for a finite thickness. This is because indium tends to segregate on the surface of InGaAs during molecular beam epitaxy growth. The segregated indium is sometimes known as a "floating layer" of indium. The amount of indium in the floating layer eventually builds up to a steady state value for a particular growth temperature and nominal (thick film) InGaAs growth temperature. For an $In_{0.2}Ga_{0.8}As$ grown at around 500° C., the floating layer of Indium may correspond to about one monolayer of InAs. FIG. 9 shows a prior art calculation of the segregated indium (equivalent monolayer coverage) versus nominal InGaAs thickness. It can be seen that three to four nanometers of InGaAs may have to be grown to reach steady state conditions if the initial concentration of Indium on the surface (where $X_0$, in monolayers (MLs) is zero).

Figure 10:
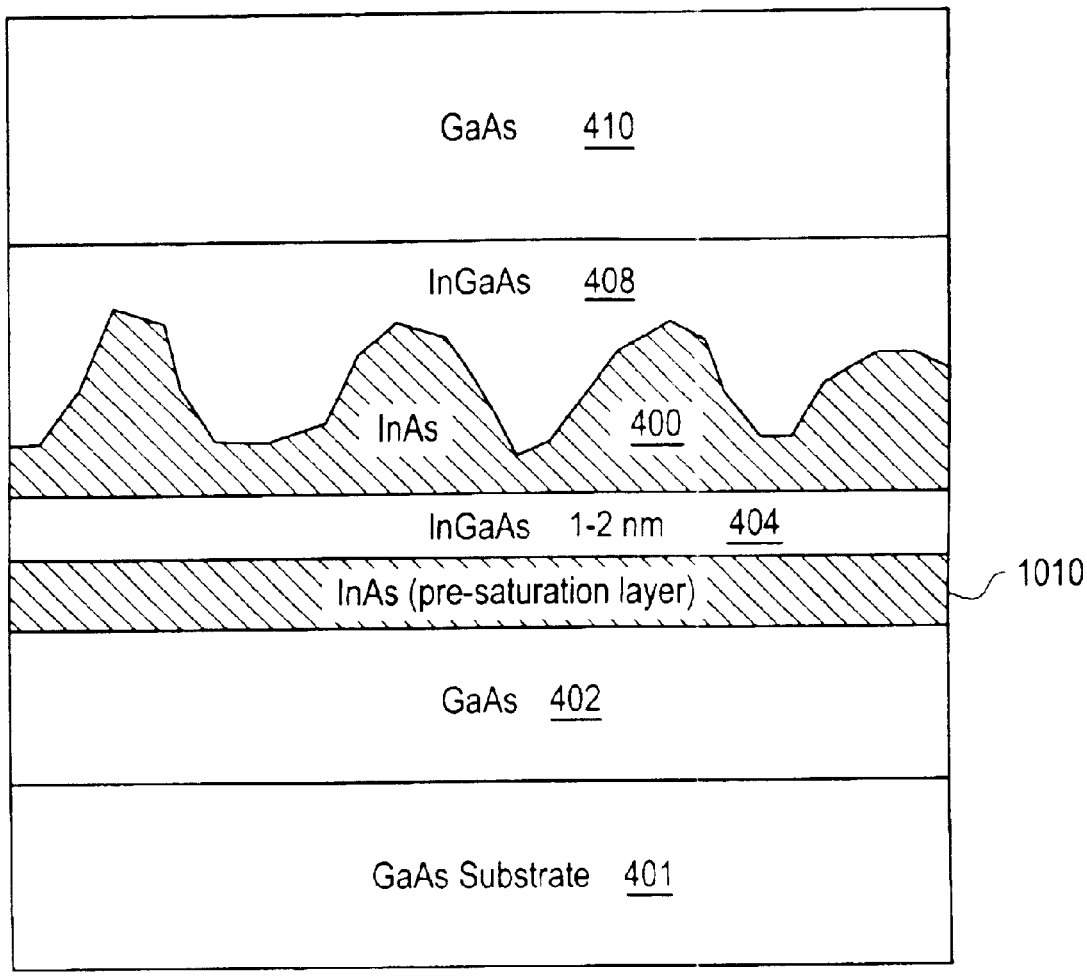
FIG. 10 illustrates a growth sequence for pre-saturating a bottom InGaAs well layer with a floating layer of indium.

FIG. 10 shows an embodiment of a growth sequence in which the growth is interrupted subsequent to bottom barrier layer 402 and a floating layer of InAs 1010 is deposited having an Indium monolayer thickness approximating the equilibrium monolayer coverage (e.g., about one monolayer equivalent of InAs, although an equivalent monolayer coverage between 0.5 to 1.5 may be beneficial). The bottom well layer 404 is then grown. As indicated in FIG. 9, if the InGaAs layer begins with an indium monolayer coverage close to its equilibrium value, only a comparatively thin layer of InGaAs need to be grown to achieve a reproducible alloy composition. Consequently, the inventors have recognized that a a bottom well layer 404 may be grown having a thickness of less than two nanometers while also achieving a reproducible alloy composition of the surface of bottom well layer 404. In one embodiment, bottom well layer 404 has a thickness of one nanometer or less. Note that the floating layer of InAs 1010 contributes to the total InAs monolayer coverage on the surface which results in the formation of dots when InAs is deposited for forming dots 406. Consequently, it will be understood that in one embodiment the equivalent monolayer coverage for forming InAs dots 406 includes the InAs monolayers deposited after the growth of bottom well layer 404 combined with the InAs monolayer coverage of presaturation floating layer 1010. As an illustrative example, if the desired equivalent InAs monolayer coverage for forming quantum dots is 2.4 monolayers and one monolayer of InAs is deposited as a floating layer of InAs 1010, then only about 1.4 monolayers of InAs needs to be deposited subsequent to the growth of bottom well layer 404 to achieve the desired equivalent monolayer coverage of InAs of 2.4 equivalent monolayers.

Figure 11A:
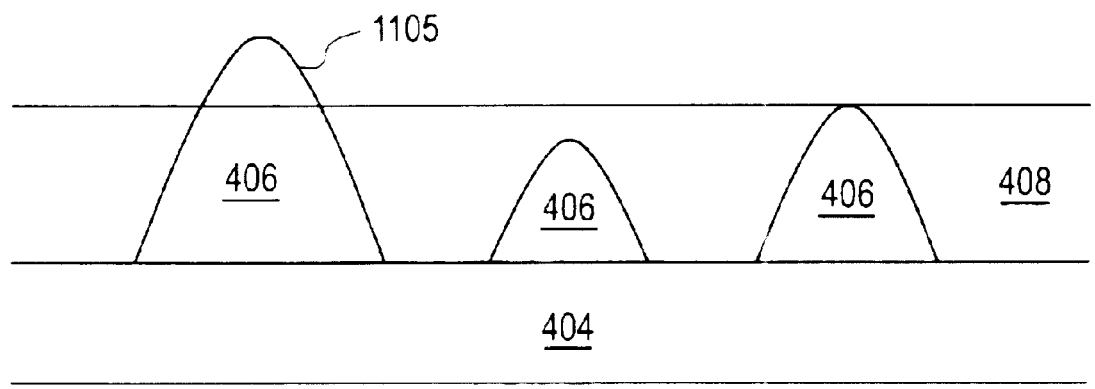
FIG. 11A is a side view illustrating how size variation in the thickness of quantum dots may cause a portion of some quantum dots to protrude from the quantum well into the barrier layer.

Photoluminescence studies by the inventors indicate that it is desirable that all of the quantum dots not significantly penetrate the upper barrier layer 410. FIG. 11A illustrate a portion of the growth process after the top InGaAs well layer 408 has been grown over InAs islands 406. As previously discussed, there is a random size distribution of the InAs islands 406 due to the statistical nature of the growth process. Consequently, some of the islands 406 may have protruding portions 1105 that are not embedded within top well layer 408 unless well layer 408 is made thicker than the largest thickness variation of islands 406. Studies by the inventors of the present patent application indicate that protruding portions 1105 may reduce the optical quality of the structure, especially upon annealing, and may have other deleterious effects. Since protruding portions 1105 may cause a substantial change in the optical properties of its corresponding quantum dot 406 it is desirable to reduce the percentage of dots having a protruding portion 1105.

Figure 11B:
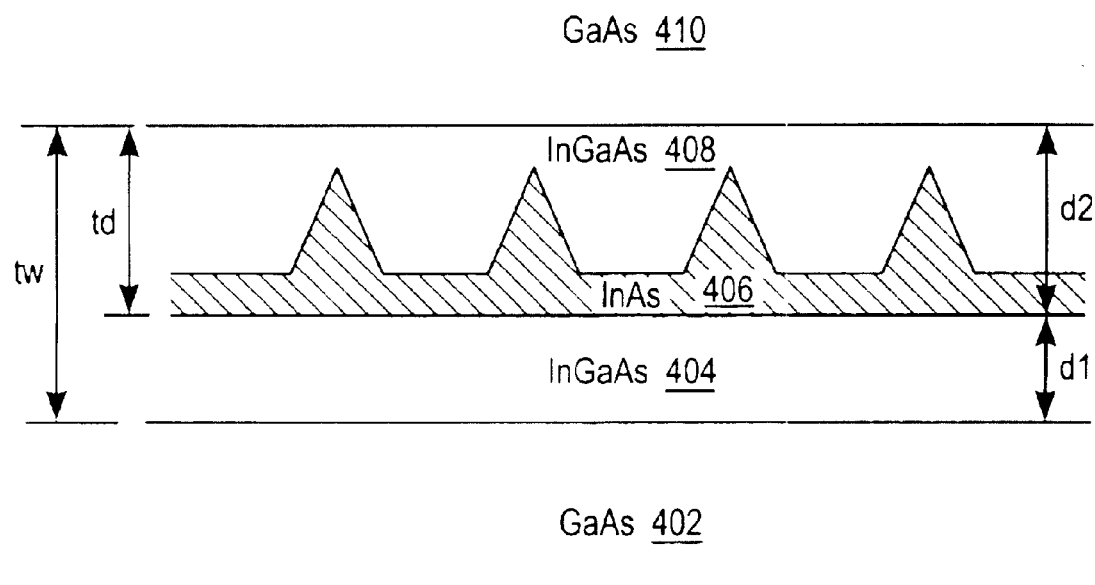
FIG. 11B illustrates a first growth sequence of layers with asymmetric placement of dots within the well to facilitate embedding quantum dots in wells.

FIG. 11B is a side view showing a layer sequence for ensuring that the quantum dots are completely embedded in the quantum well. In the embodiment shown in FIG. 11B, the thickness, $d_2$, of the upper well layer 408, is selected to be greater than the mean dot thickness td. Note that the dots do not have to be symmetrically placed in the center of the well. For example, in one embodiment, $d_2$ is much thicker than the thickness, $d_1$, of lower well layer 404. In one embodiment, the thickness of bottom well layer 404 is selected to be as thin as practical while achieving a reproducible composition (e.g., 1 to 2 nanometers thickness). As an illustrative example, lower well layer 404 may have a nominal thickness of 2 nanometers and the upper well layer 408 may have a nominal thickness of 8 nanometers. For a constant total well thickness, $t_w$, this configuration permits the widest possible variation in dot height with all of the dots embedded in the well.

Figure 11C:
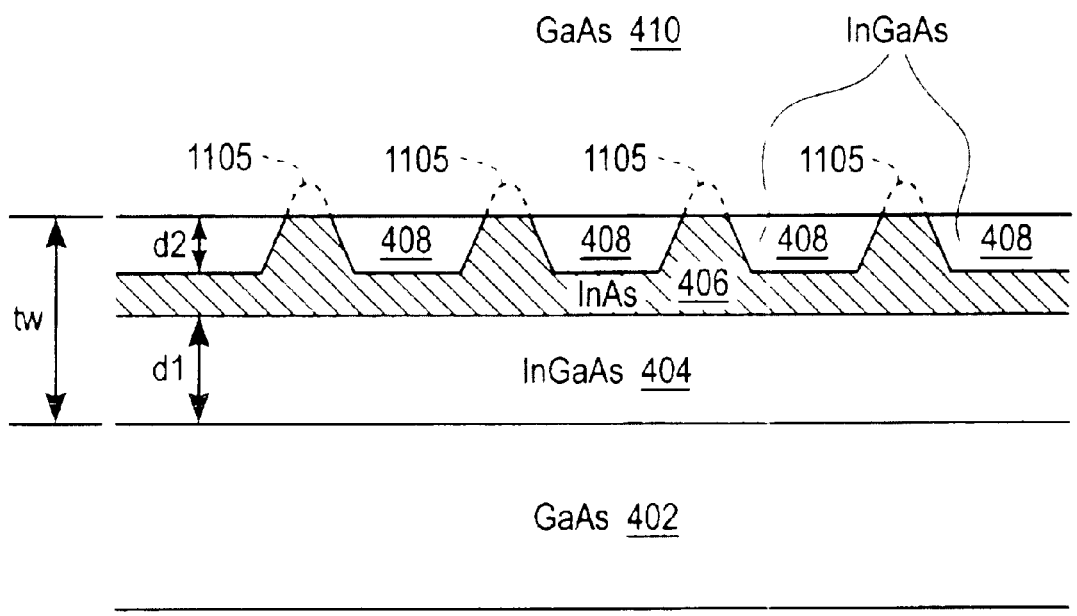
FIG. 11C illustrates a growth sequence of layer in which the quantum dots are trimmed in thickness after the well layer is grown.

FIG. 11C illustrates a growth sequence for an embodiment in which protruding portions 1105 of dots 406 are removed using a desorption step. In this embodiment after the upper well layer 408 is grown the growth is interrupted at a sufficiently high temperature and for a sufficient length of time to desorb InAs from protruding regions 1105 (shown in phantom in FIG. 11C because they are removed during the desorption process resulting in a substantially planar surface). In one embodiment, a small number of monolayers of GaAs may be grown prior to the desorption process. The growth is resumed after the desorption step and the barrier layer 410 is grown.

Photoluminescence or other characterization techniques may be used to select a desorption time and temperature that removes protruding regions 1105. Typical times and temperatures are a desorption temperature of 590° C. for one minute at a sufficient arsenic flux to maintain an arsenic stable GaAs surface. In one embodiment, the temperature is selected so that a GaAs surface is stable but an InAs surface desorbs. As previously described, in one embodiment, a small number of monolayers of GaAs may be deposited prior to the desorption process to facilitate preserving the quality of planar portions of the upper InGaAs well layer during the desorption process. As indicated by the hatched regions, the desorption step ensures that the resulting quantum dots 406 do not extend into the upper barrier layer 410 in the final structure. Photoluminescence experiments indicate that the processs illustrated in FIG. 11C has a photoluminescence FWHM for the quantum dots of about 25 to 35 meV, which is about a factor of two lower than the FWHM for quantum dots formed using the process illustrated in FIG. 11B, which is attributed to an improved uniformity in quantum dot thickness. Consequently, the embodiment shown in FIG. 11B provides two benefits: it eliminates protruding portions and also improves the thickness uniformity of the quantum dots. In one embodiment, the mean thickness of the as-grown islands is selected to be greater than the thickness of the upper InGaAs well layer. Consequently, in this embodiment all of the dots are trimmed in height by the desoption step and will have a thickness that is approximately the same as the upper InGaAs well layer.

One benefit of the growth techniques of the present invention is that they permit a high density of quantum dots to be grown in a comparatively thin quantum well, which reduced the strain-thickness product to achieve a particular dot density and corresponding peak optical gain of the quantum dot layer. Moreover, this can be simultaneously achieved at comparatively long ground state emission wavelengths of commercial interest, such as emission wavelengths of at least 1260 nanometers. For example, with a well thickness of 9 nanometers, a well Indium alloy fraction of 0.15, an InAs monolayer coverage of 2.1 monolayers grown at a temperature corresponding to a dot density of $1 \times 10^{11}$ per square centimeter, the corresponding average strain-thickness product (calculating an average indium alloy fraction in the well of 20% by a weighted average of the equivalent InAs thickness associated with the InAs dots and the InGaAs well layers) is the strain associated with the average composition (1.45%) multiplied by the well thickness (90 Angstroms), or a strain thickness product of 130.5 Å-%.

Figure 12:
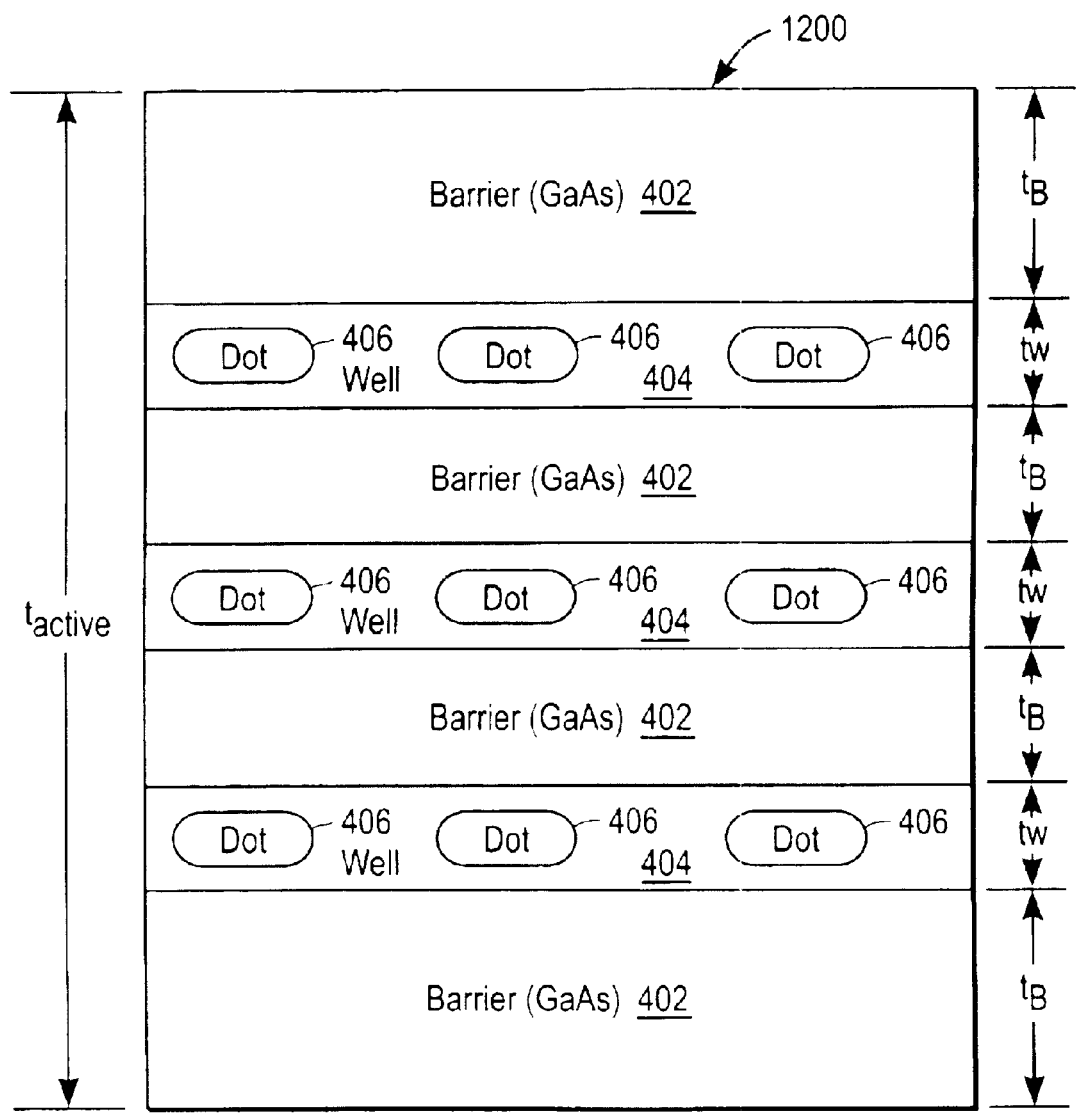
FIG. 12 illustrates a growth sequence for an active region having a plurality of quantum dot layers.

FIG. 12 shows a growth layer sequence and layer thicknesses for an active region 1200 of an optical device. It will be understood that active region 1200 may comprise part or all of a waveguide core within other optical waveguide cladding layers. The capability to form individual quantum dot layers having a low strain-thickness product facilitates stacking four or more quantum dot layers in the active region of a suitable laser waveguide having a core waveguide thickness, $T_{active}$, of between about 200 nanometers to 300 nanometers.

An important limitation in designing an individual quantum dot layer or a sequence of quantum dot layers is the strain-thickness product of the active region. An InGaAs layer grown on a GaAs substrate is a strained layer. If the strain-thickness product of the strained layer is sufficiently low, a high quality strained layer may be achieved. However, if the strain-thickness product is excessively high, deleterious misfit dislocations tend to form if a critical thickness is exceeded. There are a variety of techniques used in the art to calculate the critical thickness of a single strained layer.

Figure 13:
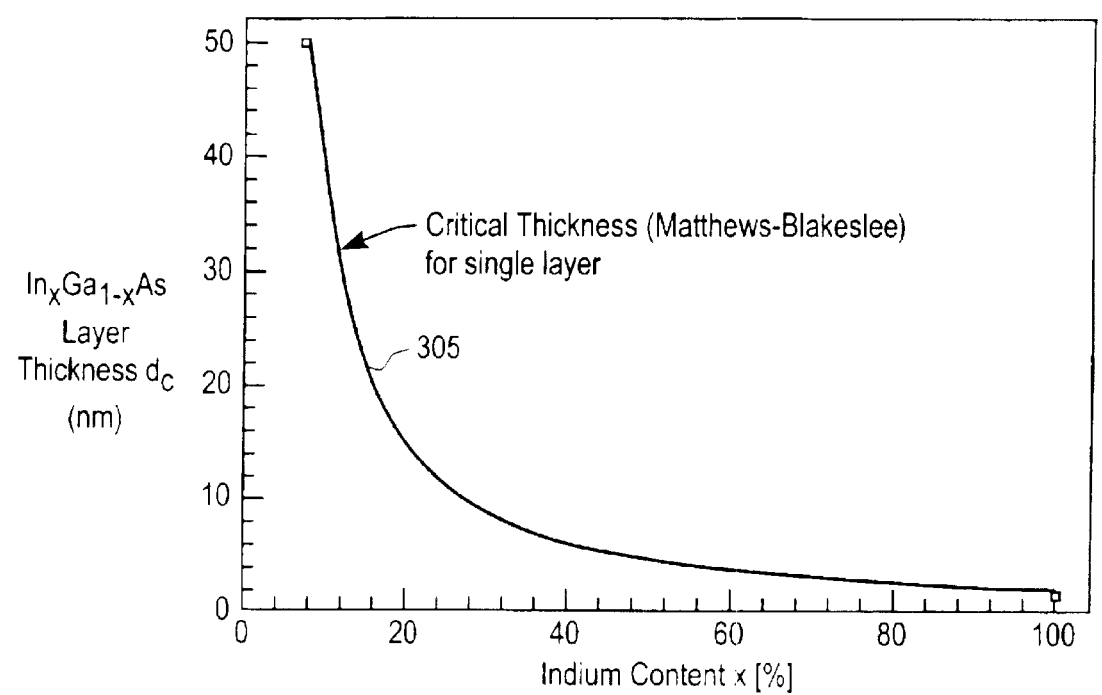
FIG. 13 shows a plot of a relationship for calculating a critical thickness for a single layer.

FIG. 13 is a plot of the commonly used Matthews-Blakeslee relationship for calculating a critical thickness for strained layers having a uniform alloy composition (which may be used to calculate a lower bound for an embedded quantum dot layer). Curve 1305 is a curve indicating a critical thickness. Regions above curve 1305 tend to form dislocations. The Matthews-Blakeslee curve 1305 indicates that a single quantum dot layer having an average composition of well layers and dots of $In_{0.2}Ga_{0.8}As$ has a critical thickness of at most 12 nanometers. However, provided the quantum dots are not dislocated themselves, the Matthews-Blakeslee critical thickness is a conservative estimate for non-equilibrium crystal growth.

Additionally, for a sequence of quantum dot layers of an active region 1200, an average strain-thickness product should be below a threshold average strain (e.g., 0.5%). The strain thickness product of an individual quantum dot layer is $E_w T_w$, where $E_w$ is the strain of a well layer and $T_w$ is the thickness of the well. The strain thickness product of an individual barrier layer is $E_b T_b$, where $E_b$ is the strain of the barrier layer and $T_b$ is the thickness of the barrier layer. For a sequence of n layers of dots, the average strain, $E_{av}$, is:

$$E_{av} = \frac{(n+1)E_b T_b + n E_w T_w}{(n+1)T_b + n T_w}.\qquad\text{Eq. 1}$$

For GaAs barriers (which are unstrained), this simplifies to:

$$E_{av} = \frac{n E_w T_w}{(n+1)T_b + n T_w}.\qquad\text{Eq. 2}$$

Equation 1 can be re-expressed as a relationship between the barrier thickness, well thickness, modified average strain, strain in the barriers, and strain in the well:

$$T_b = \frac{n T_w (E_w - E_{av})}{(n+1)(E_{av} - E_b)}\qquad\text{Eq. 3}$$

For GaAs or AlGaAs layers grown on a GaAs substrate $E_b \approx 0$ so that the barrier thickness is:

$$T_b = \frac{n T_w (E_w - E_{av})}{(n+1)E_{av}}.\qquad\text{Eq. 4}$$

Equation 4 can be used to derive a relationship for a minimum barrier layer thickness. If the average strain is selected to be less than a maximum average strain (for example, and average strain less than about 0.51%), $E_{avmax}$, then the following relationship holds:

$$Tb > \frac{Tw[n(Ew - Eav\max)]}{(n+1)Eav\max}. \qquad \text{Eq. 5}$$

As an illustrative example, if $E_{avmax}$ is 0.4 and $E_w$=1.45 for an average In alloy composition of about $In_{0.2}Ga_{0.8}As$ then Tb>2.625 Tw(n/(n+1)). If Tw is 9 nm for a structure, then the minimum barrier thickness for a structure with 6 quantum dot layers is about 20 nanometers.

Figure 31:
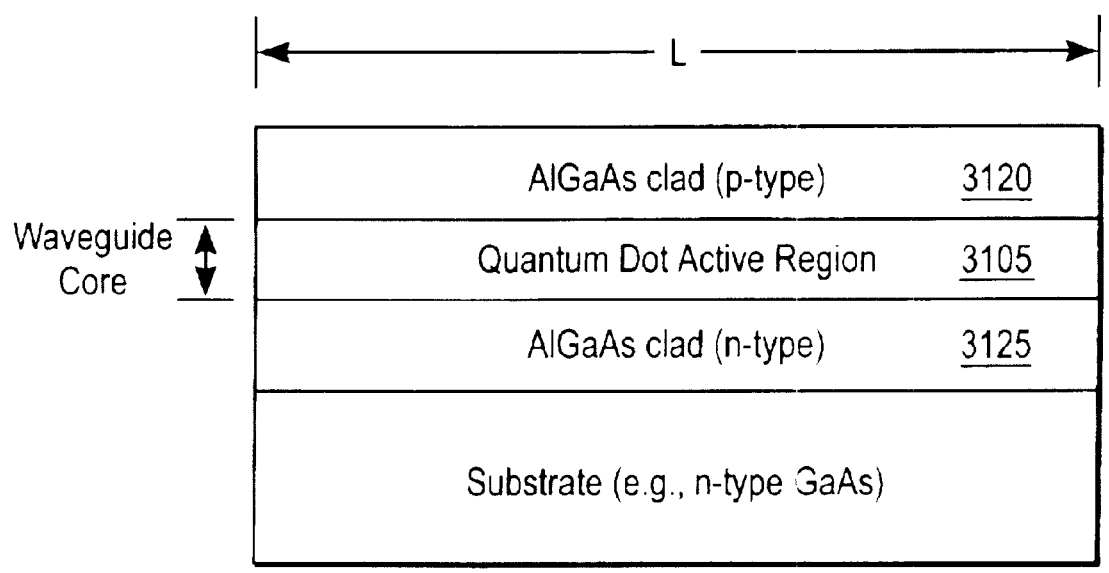
FIG. 31 is a side view of a quantum dot laser cavity.

The quantum dots may be utilized in a variety of laser structures. For example, referring to FIG. 31, AlGaAs cladding layers 3120 and 3125 may be used to provide vertical optical confinement of light to a quantum dot active region 3105 of an optical cavity having a length L. Optical feedback for the optical cavity may be provided using any suitable means, such as reflective facets or a Bragg grating. Lateral optical confinement may be provided using any suitable process. For example, a ridge waveguide may be used to provide lateral optical confinement. Individuals lasers may be fabricated as Fabry-Perot lasers, distributed bragg reflector lasers, distributed feedback lasers, or external cavity lasers. By selecting growth conditions to avoid deleterious blue-shifting, the size of the quantum dots (height, width, and length) may be selected to provide gain at a variety of wavelengths, such as the commercially important 1.3 wavelength range.

Figure 14B:
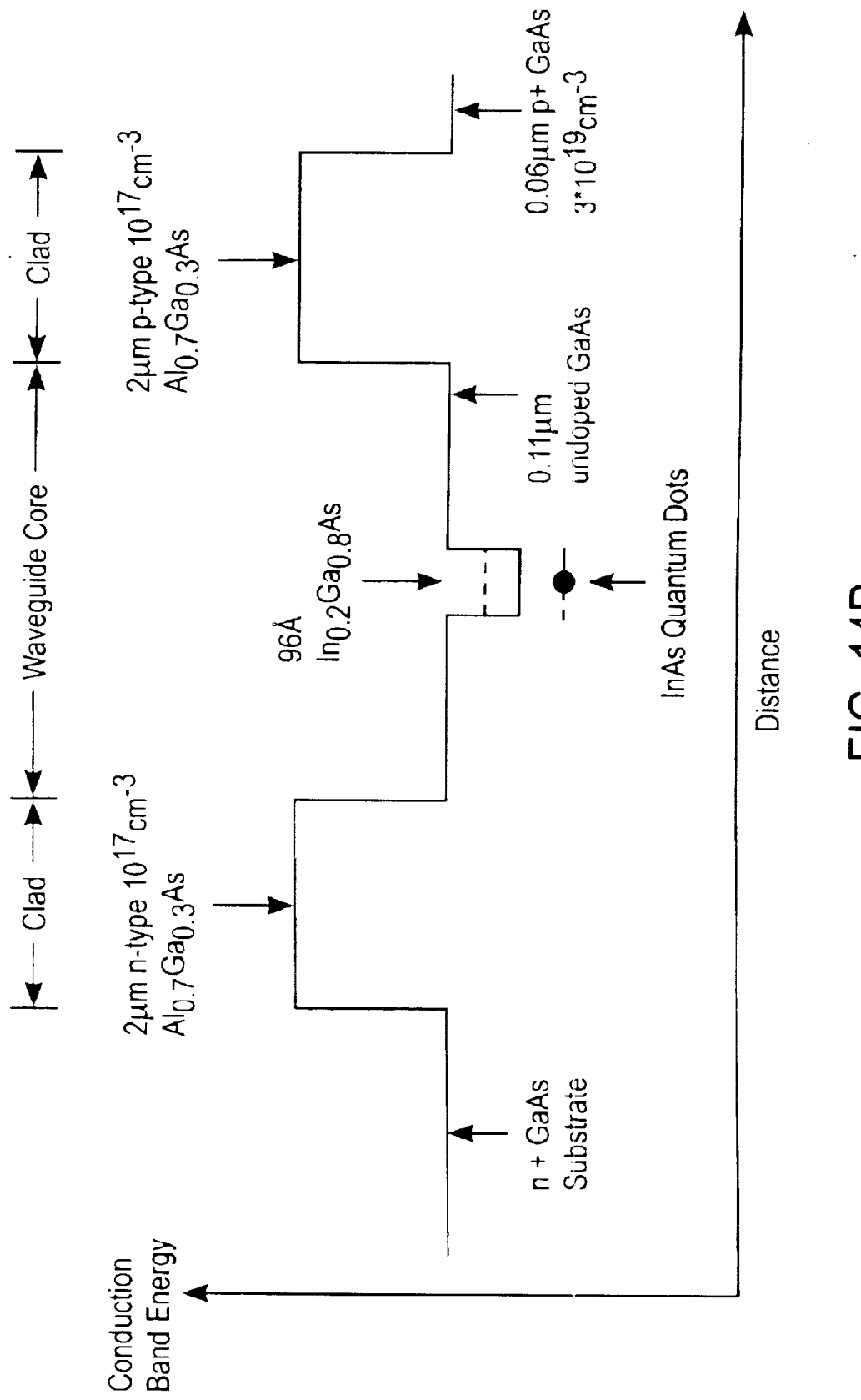
FIG. 14B shows a conduction band diagram for the laser structure of FIG. 14A.

FIG. 14A is an illustration of a growth sequence for a laser having a single layer of quantum dots and FIG. 14B shows a corresponding conduction band energy diagram. It will be understood from the conduction band energy diagram that the quantum well assists the quantum dots to capture and retain injected carriers due to the lower bandgap energy of the central quantum well layer compared with surrounding quantum well barrier layers. Referring back to FIG. 14A, an n-type GaAs buffer layer is grown on a GaAs substrate. An approximately two micron thick first AlGaAs cladding layer is then grown. This is followed by an undoped GaAs waveguiding layer about 0.11 microns thick, which is preferably undoped to reduce absorption losses. A presaturation layer 1415 comprising approximately one monolayer of InAs is deposited during a growth interruption step. The growth temperature is adjusted to approximately 490° C. during the growth interruption. An approximately 2 nanometer InGaAs bottom well layer 1420 is then grown. An InAs layer corresponding to a monolayer coverage of about 1.4 monolayers is deposited to form InAs islands. Note that since a one monolayer presaturation layer 1415 of InAs was deposited prior to the bottom well layer 1420 that the total InAs coverage on the surface of the bottom InGaAs well that produces the InAs islands is approximately 2.4 equivalent monolayers. An approximately 7.6 nanometer thick InGaAs top well layer 1440 is then grown. In one embodiment, several monolayers of GaAs are then grown, followed by a growth interruption step in which the substrate temperature is raised to about 610° C. The growth interruption step preferably lasts sufficiently long to desorb excess segregated indium from the surface prior to commencing growth of a second GaAs waveguidng layer 1445 which has about the same thickeness as the first waveguiding layer. An upper AlGaAs cladding layer 1450 is then grown, followed by a GaAs cap layer 1455.

Layers 1410, 1420, 1430, 1440, and 1445 form a waveguide core region having a higher refractive index than surrounding AlGaAs cladding layers 1405 and 1450. Consequently, a transverse optical mode will be confined by the laser structure. A fraction of the waveguide mode will be confined in the portion of the structure occupied by the quantum dots.

The p-type layers, undoped layers, n-type layers form a p-i-n laser structure. While one substrate polarity is shown, it will be understood that doping polarity of the layers may be reversed from what is shown. The quantum well layers 1420 and 1440 provide an additional benefit of providing a means to improve carrier capture to the quantum dots and also serve to reduce thermionic emission of carriers out of the dots. This provides an important benefit for quantum dots lasers. In a quantum dot laser the fill factor of quantum dots in an individual quantum dot layer is low, typically less than 10%, depending upon the dot density and mean dot size. In some cases, the fill factor is less than 5%. Since the quantum dots are disposed within the quantum wells, carriers captured by the well layer of the quantum wells may enter the quantum dots. Additionally, the barrier layers of the quantum well also serve to reduce thermionic emission out of the quantum dots.

Figure 15:
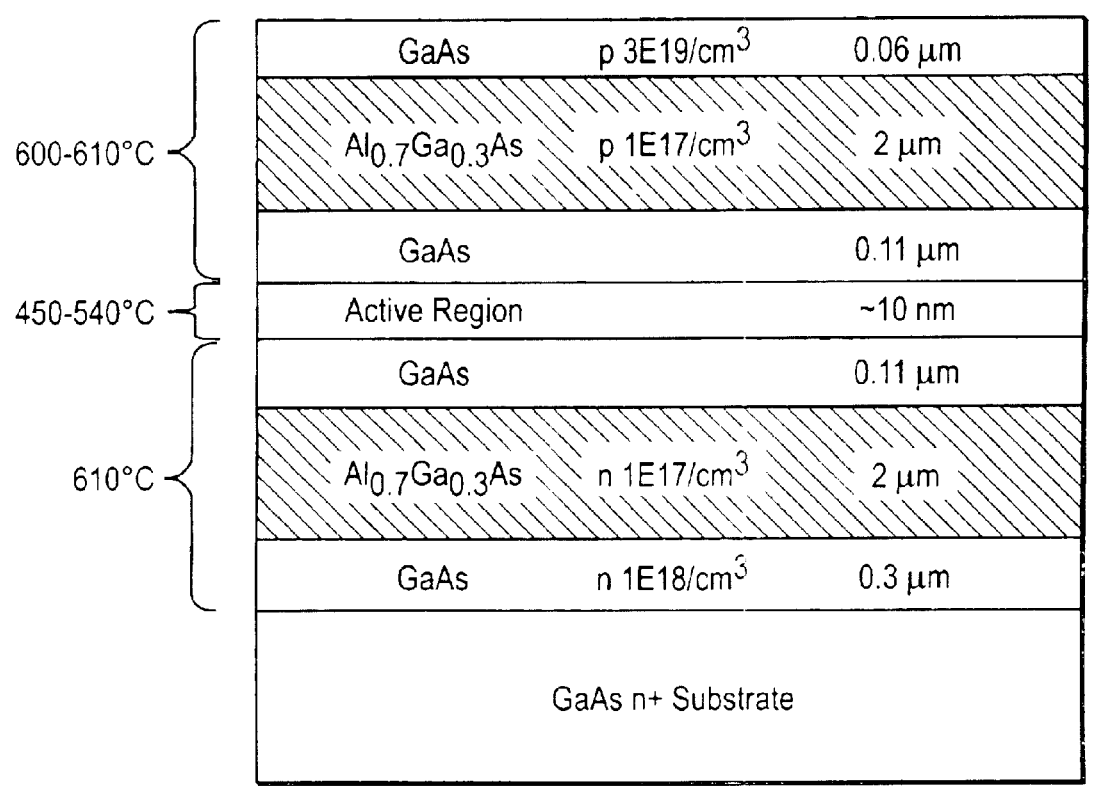
FIG. 15 shows a growth sequence for a quantum dot laser with preferred temperature ranges for growing each layer.

FIG. 15 shows a similar layer sequence as FIG. 14. However, as indicated by FIG. 15, the growth temperature of the active region may be varied to control the density of quantum dots.

Figure 16:
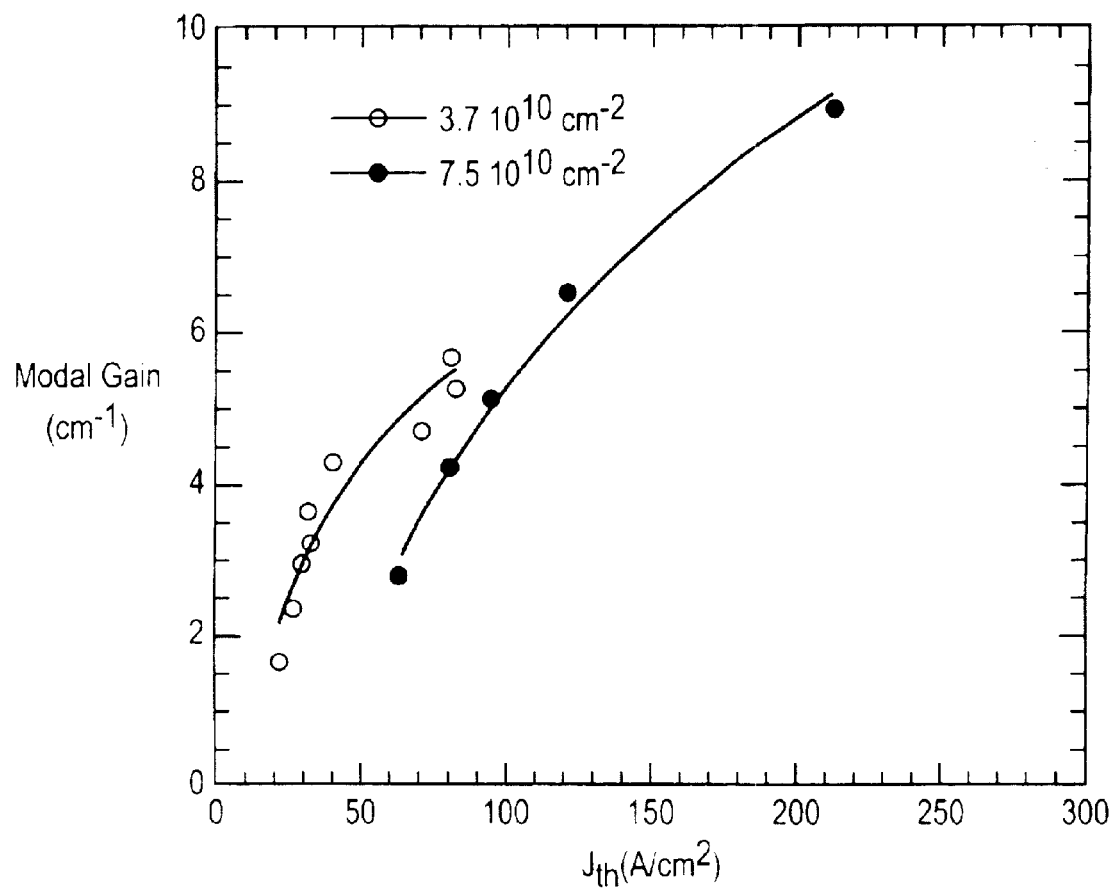
FIG. 16 shows plots of measured modal gain versus threshold current density for quantum dot laser having two different quantum dot densities.

FIG. 16 shows plots of measured modal gain versus current density for laser structures grown at growth temperatures producing two different dot densities. Referring to FIG. 16, experiments data indicates that the saturated ground state modal gain increases approximately linearly with dot density.

Figure 17:
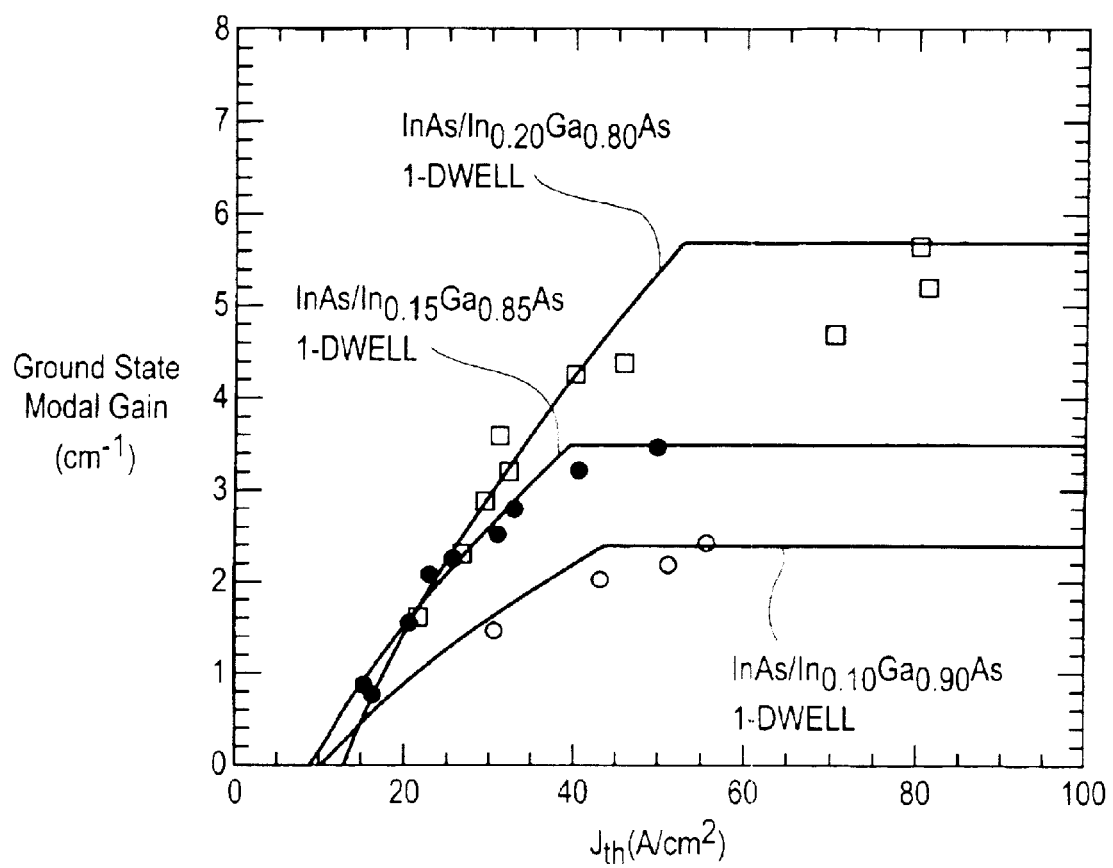
FIG. 17 shows plots of ground state modal gain versus threshold current density for quantum dot lasers having a single layer of quantum dots with three different compositions of the InGaAs quantum well.

FIG. 17 shows plots of ground state modal gain for a laser structure similar to that of FIG. 14 with the alloy composition of the InGaAs well layers varied. It can be seen that the saturated (maximum) ground state modal gain increases as the In alloy fraction increases.

Figure 18:
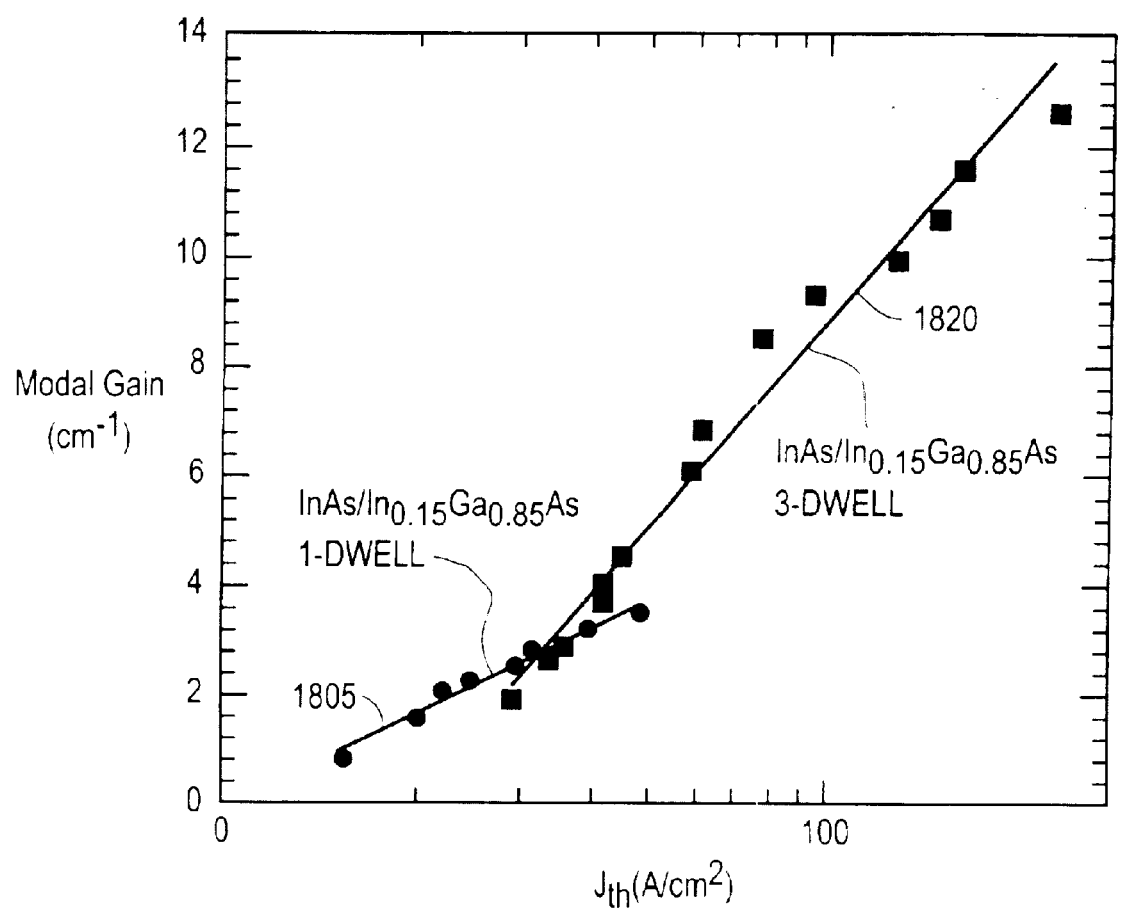
FIG. 18 shows a plot of modal gain versus threshold current density for a quantum dot lasers having one and three layers of quantum dots.

As previously discussed, multiple quantum dot layers can be used in an active region as long as the separation between quantum dot layers is large enough that the strain within a quantum well remains below a critical thickness for forming dislocation and the average strain with the waveguide core remains below a threshold average strain. FIG. 18 shows a plot 1805 of modal gain versus current density for a laser structure having a single layer of quantum dots and a corresponding plot 1820 for a laser structure having three quantum dot layers, with the quantum well of each quantum dot layer separated from its neighboring quantum dot layers a 10 nanometer thick barrier layer. For this example, the quantum dot layers are spaced sufficiently close that the optical confinement for each layer of quantum dots is about the same as for a single layer of quantum dots, resulting in a cumulative three-fold increase in total modal gain.

The growth conditions and layer sequence of a quantum dot laser may be adapted for a particular application. In some applications a comparatively high ground state saturated modal gain is desired. For example, in some commercial laser applications, such as OC-48 and OC-192 compliant lasers, an emission wavelength of at least 1260 nanometers and a cavity length of no more than 500 microns is required, with a cavity length of 300 microns being desirable to reduce the photon lifetime. This wavelength may be achieved by designing the laser to operate off of the ground state (longest wavelength emission) and by selecting growth conditions that minimize blue-shifting of the quantum dots during growth (e.g., by appropriately selecting the growth conditions of cap layer and thick cladding to minimize blue-shifting as described above). Moreover, the dot height, dot diameter, dot composition and the InGaAs well width and composition influence the ground state transition energy and may be selected to achieve a ground state optical transition having an emission wavelength of greater than 1260 nanometers.

One benefit of the quantum dot layers of the present invention is that they have an extremely low linewidth enhancement factor. A low linewidth enhancement factor reduces the deleterious chirp when a laser is directly modulated by changing its drive current (the current injected into the p-i-n laser diode to change its light output. The linewidth enhancement factor, $\alpha$, describes the degree to which variations in the carrier density, N, alter the index of refraction, n, of an active layer for a particular gain, g, at the lasing wavelength, $\lambda$. The linewidth enhancement factor can be expressed mathematically as:

$$\alpha = \frac{4\pi}{\lambda} \frac{dn/dN}{dg/dN}$$

Experiments by the inventors indicate that the linewidth enhancement factor of the quantum dot lasers is as low as 0.1, which almost twenty times lower than for comparable quantum well lasers at about the same wavelength. The low linewidth enhancement factor correspondingly reduces wavelength chirp for high frequency direct modulation of the lasers. Chirp becomes a progressively more severe problem in conventional lasers used in fiber-optics systems as the modulation data rate increases. Consequently, in some conventional fiber optics system, an external modulator (a modulator distinct from the laser) is used to modulate a constant power output of a laser. By way of contrast, a low linewidth enhancement factor of less than 0.2 for the quantum dot lasers of the present invention would permit direct high speed modulation of the lasers with extremely little chirp. This makes the quantum dot lasers of the present invention attractive for applications in which the laser has a wavelength of at least 1260 nanometers and is directly modulated at data rates of greater than one Gbps, thereby eliminating the need for external modulators.

A variety of commercial applications, such as OC-48 and OC-192 compliant lasers, require modulation rates in excess of one Gbps. In a directly modulated laser the relaxation oscillation frequency, fr is given by the expression:

$$fr = \frac{1}{2\pi} \sqrt{\left[\frac{\eta P}{c\tau} \frac{dg}{dN}\right]},$$

where P is the photon density, $\eta$ the effective refractive index of the waveguide, c the speed of light in vacuum, $\tau$ the photon lifetime, and dg/dN the differential gain.

For direct modulation of a quantum dot laser, a low photon lifetime is required for a laser that is directly modulated at high data rates, which implies a cavity length of less than 500 microns and preferably no more than 300 microns. The saturated ground state modal gain should be at least about 25 cm$^{-1}$ for a 500 micron long cavity with 10%/90% facet reflectivity of front and rear facets, respectively; and at least 40 cm$^{-1}$ for a 300 micron long cavities with 10%/90% facet reflectivity of front and rear facets, respectively. It is also desirable that the lasers be operated at a threshold gain that is selected to be sufficiently below the saturated ground state modal gain that the differential gain (dg/dN) still remains high.

Figure 19:
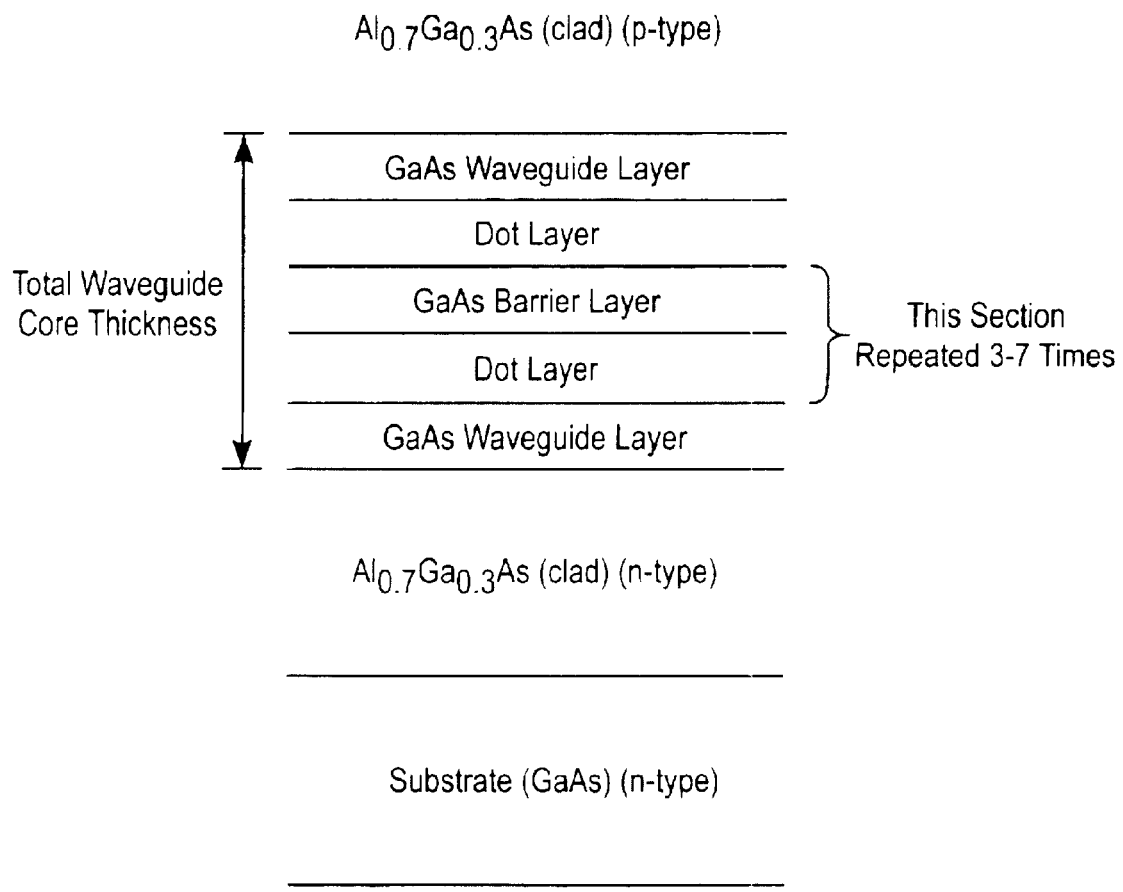
FIG. 19 shows a growth sequence for quantum dot laser having a sequence of quantum dot layers selected to achieve a high ground state modal gain.

For applications requiring a high saturated ground state modal gain, a plurality of quantum dot layers are preferably included within a waveguide core region no greater than about 300 nanometers in thickness, since a waveguide core thickness of between about 200 to 300 nanometers provides the optimum optical confinement per quantum dot layer. (Note that a waveguide core having a thickness between 200 to 300 nanometers corresponds to a distance comparable to about a half wavelength for 1.3 micron emission for the refractive index of AlGaAs waveguiding layers, for which a high optical confinement per quantum dot layer may be achieved). Since a saturated ground state modal gain of greater than 7 cm$^{-1}$ can be obtained for a single quantum dot layer, a total number of quantum dot layers in the range of four to eight is sufficient for many applications requiring a high peak optical gain. An exemplary growth sequence of a laser having 4 to 8 quantum dot layers is shown in FIG. 19. The total waveguide core thickness is preferably in the range of about 200 to 300 nanometers, since this provides the highest optical confinement per quantum dot layer. The corresponding AlGaAs cladding layers are preferably $Al_xGa_{1-x}As$ cladding layers with the molar fraction, x, between x=0.6 to x=0.8 (which can also be described in percentage terms as an aluminum arsenide percentage of between 60% to 80%), since this range tends to produce a high optical confinement consistent with growing high quality optical layers. However, it will be understood that the AlGaAs cladding layers may be grown with a lower molar fraction of aluminum but that the optical confinement may decrease, somewhat, as the molar fraction of aluminum in the AlGaAs is decreased.

It will be understood that a directly modulated laser structure may use any known packaging and contacts for supplying a modulated current to the laser p-i-n diode. For example, the laser may be a ridge waveguide laser packaged to provided a current to the diode that may be modulated at rates in excess of one Gbps.

It will also be understood that there are tradeoffs between growth conditions that increase dot density and the size uniformity of the dots. A high number density of dots in each laser increases the number of dots available to provide gain. However, this is offset, somewhat, by the fact that growth conditions that increase the dot density may also increase the size variance of the dots. For a laser structure with a high saturated ground state optical gain it is desirable to select growth conditions consistent with a high dot density per quantum dot layer with as high a dot size uniformity (minimal inhomogenous broadening) as possible. Consequently, in one embodiment of a multiple quantum dot layer laser, the growth sequence of each quantum dot layer is selected to trim the quantum dots similar to the embodiment shown in FIG. 11C.

Figure 20A:
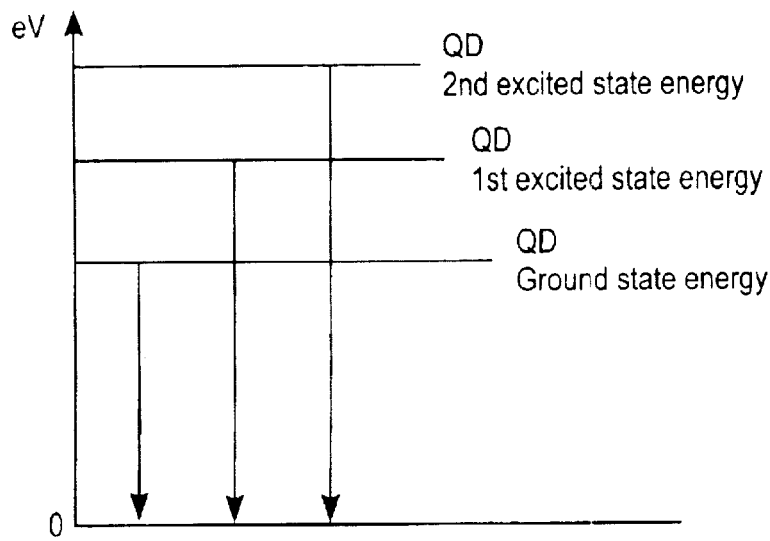
FIG. 20A illustrates transition energies for a single, ideal quantum dot.
Figure 20B:
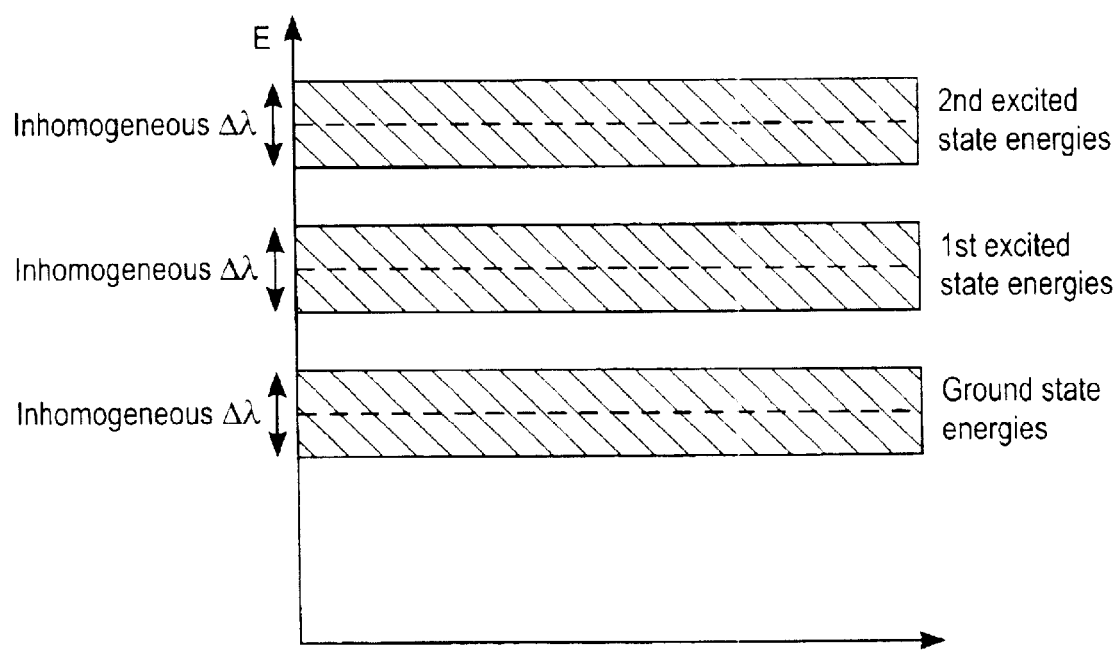
FIG. 20B illustrates inhomogenous broadening of transition energies associated with variance in quantum dot size for an ensemble of dots.

In some laser applications it is desirable to have an optical gain spectrum that extends over a substantial range of wavelengths and at a comparatively low pumping level. For this situation, a comparatively low saturated ground state modal gain may be desirable to facilitate wavelength tuning. FIG. 20A is an illustrative diagram of optical transition energies for a single quantum dot. An individual quantum dot has quantum confined energy states associated with its length, width, and height. There will be a ground state transition energy, a first excited state transition energy, a second excited state transition energy, and possibly additional transition energies, depending upon the dot size, composition, and shape. For InAs quantum dots with a nominal 7 nanometer height and 30 nanometer diameter, the difference in transition energy between the ground state transition and the first excited state transition is about 80 meV. Referring to FIG. 20B, for an ensemble of quantum dots having a distribution in size about a mean size, there will be a corresponding inhomogeneous broadening, as indicated by the hatched areas. When the quantum dots are pumped, homogeneous broadening will also occur. The degree of inhomogenous broadening can be adjusted be selecting the growth conditions that increase or decrease the size variation of the dots. Photoluminescence studies indicate that the growth conditions may be adjusted to vary the inhomogeneous broadening from a minimum of about 30 meV to at least 70 meV. Homogenous broadening of greater than 24 meV may be achieved at pump levels of several kA/cm$^2$. The homogenous broadening may be attributed, for example, to collisions of electrons with phonons and other electrons.

The interplay of homogeneous and inhomogeneous broadening acts to broaden the optical gain spectrum. The interplay of homogenous and inhomogenous broadening may more than double the width of the gain response. A lasing-mode photon will receive gain from not only the energetically resonant dots but also from other non-resonant dots that lie within the range of homogenous broadening. Consequently, if the difference between the central ground state transition energy and successive excited states is the range of between about 30 meV to 80 meV, a continuous optical gain spectrum may be achieved at a comparatively low current density because the combination of homogeneous and inhomogeneous broadening produces a continuous gain spectrum.

In one embodiment of the present invention, the growth parameters are selected to achieve a difference in energy value of successive quantum dot transition energies that is between about 30 to 80 meV. In particular, in one embodiment, growth conditions may be selected to vary the mean size of the quantum dots to adjust their transition energies. The growth conditions are preferably further selected to achieve a sufficient degree of inhomogeneous broadening. In one embodiment, the inhomogeneous broadening is selected to be at least half the difference in energy value between the ground state transition energy value and the first excited energy state value. In another embodiment, the inhomogeneous broadening is selected to be about 20–30 meV below the difference in energy levels such that the combination of homogeneous and inhomogeneous broadening forms a continuous optical gain spectrum at comparatively low threshold current.

Figure 21:
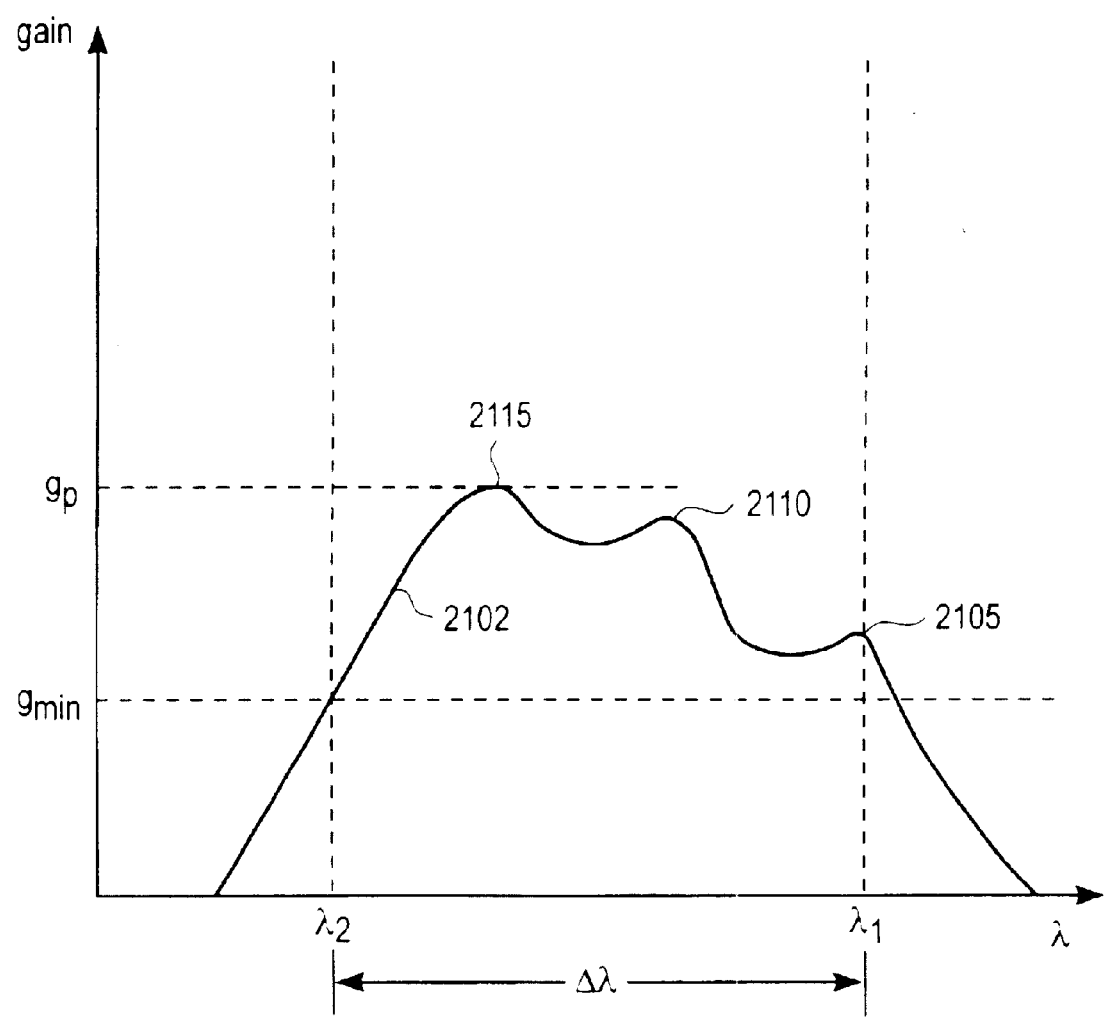
FIG. 21 illustrates a method of forming a continuous quantum dot optical gain spectrum over an extended wavelength range.

A semiconductor laser including a quantum dot active region may be designed to operate over a wide range of wavelengths at a comparatively low current. FIG. 21 is an illustrative plot 2110 of cavity optical gain ($e^{2gL}$ where g is the gain per unit length and L is the length of the gain medium in the cavity) of a laser quantum dot active region at a selected current. Referring to FIG. 21, a quantum dot active region may be designed to have a ground state quantum level corresponding to a peak 2105 at a wavelength $\lambda_1$. In the illustrative diagram the current is selected such that the ground state modal gain at $\lambda_1$ is saturated with a saturated value greater than $g_{min}$, a minimum gain, to overcome a resonator loss that includes a mirror loss and an absorption loss. If an extended tuning range is desired, the drive current is selected to populate the excited states. For example, the first excited quantum states (e.g., first excited state 2110 and second excited state 2115) associated with quantum confinement along the length and width of the dots may be designed to provide additional higher energy states, as indicated by the peaks 2110 and 2115 between $\lambda_1$ and $\lambda_2$.

By way of contrast, a conventional quantum well active region providing gain over a comparable wavelength would not have a saturable gain at the first ground state of the quantum well, necessitating an extremely high current density to achieve the minimum gain over the entire wavelength range. Rough estimates by the inventors indicate that a quantum dot laser can achieve a wide tuning range with approximately ten times less current than a comparable quantum well laser. In one embodiment the inhomogeneous broadening and the difference in energy of the ground state transition energy, the first excited state transition energy, and the second excited state transition energy is selected to permit a continuous optical gain spectrum of at least 150 nanometers for a maximum threshold current density. The drive current is preferably selected to at least saturate the ground state modal gain. In one embodiment with multiple layers of quantum dots, the growth parameters of the dots in different layers may be adjusted such that each layer of quantum dots has a different sequence of optical transition energies selected to form a sequence of transition energies for the layers that facilitates forming a broad, continuous optical gain spectrum. For example, a first quantum dot layer could have a first ground state transition energy and associated excited state transition energy levels. The second quantum dot layer could have dot characteristics (e.g., size, shape, and composition) selected to have its ground state transition energy and excited state transition energy levels (e.g., first and second excited state transition energy) offset in value (e.g., by 10–40 meV) with respect to corresponding transition energy levels of the first layer of quantum dots.

Figure 22:
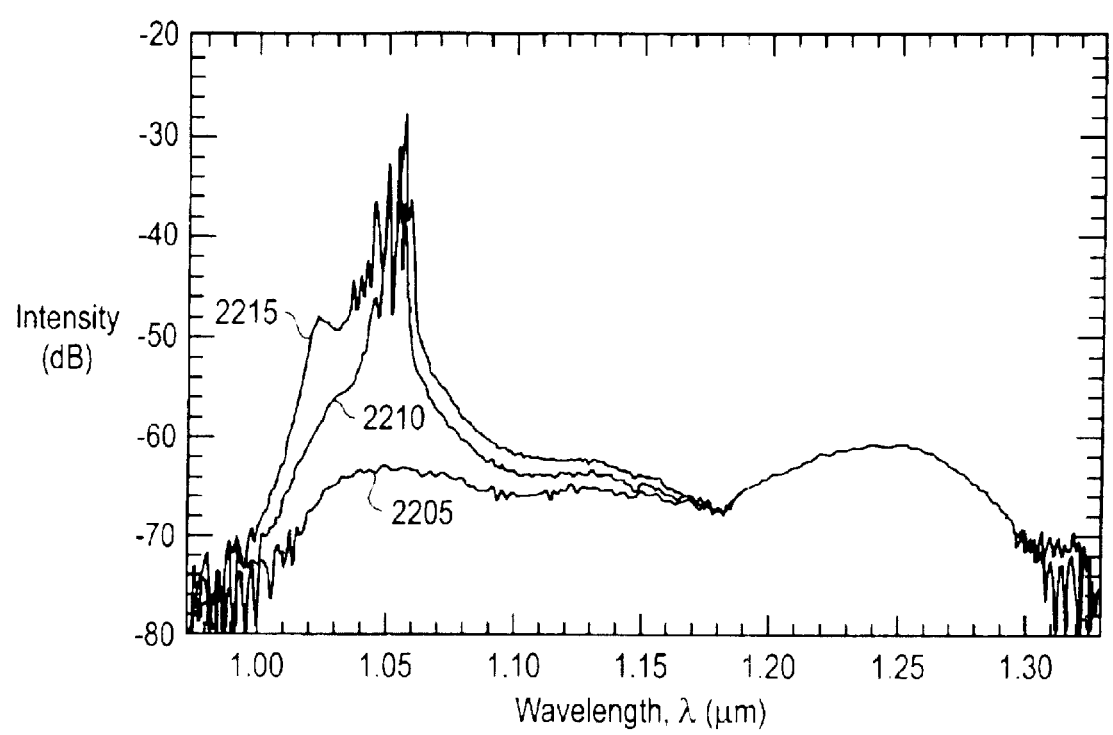
FIG. 22 shows plots of electroluminescence intensity versus wavelength for a quantum dot laser structure with three different driver currents selected to achieve a continuous optical gain spectrum over and extended wavelength range.

FIG. 22 is plot of amplified spontaneous emission intensity versus wavelength for a laser cavity fabricated from a structure similar to that shown in FIG. 14B and having a single quantum dot layer. The nominal dot height is about 7 nanometers grown at a temperature of approximately 490° C. with a dot density corresponding to about 7.5×10$^{10}$ cm$^2$. The front facet is anti-reflection coating to suppress Fabry-Perot lasing and the cavity length is about 1.7 mm. Plot 2205 is for a drive current of 500 mA, plot 2210 is for a drive current of 600 mA, and plot 2215 is for a drive current of 700 mA. The drive current for all three plots is sufficiently high that the ground state modal gain is saturated, which accounts for the convergence of the curves between 1.20 to 1.30 microns. The drive current is sufficiently large that excited quantum dot states are populated, corresponding to a continuous gain over more than 200 nanometers. At the higher pump levels of plots 2210 and 2215, the onset of lasing at the second excited state (1.05 microns) begins to occur.

Figure 23:
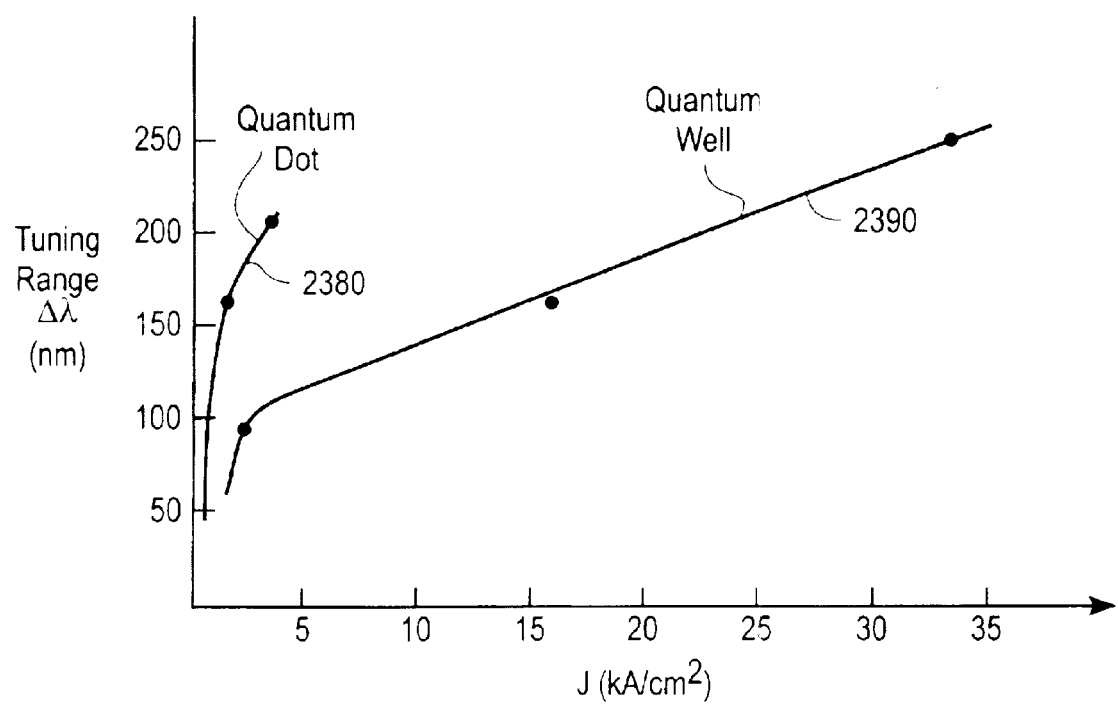
FIG. 23 shows plots of wavelength tuning range for quantum dot and quantum well lasers versus current.

FIG. 23 is an illustrative plot of tuning range versus current density for a nominal 1.3 micron wavelength laser tuned to shorter wavelengths. The quantum dot plot 2380 is based upon experimental data of the inventors. The quantum well plot 2390 is based upon various numbers published in the literature. Referring to plot 2280, quantum dot lasers permit about 70 nm of tuning per each 1 kA/cm$^2$ increase in pump current density. By way of contrast a conventional quantum well requires about 2.3 kA/cm$^2$ to achieve a 70 nm tuning range. It can be seen in plot 2390 that the quantum well has an abrupt increase in threshold current range when the tuning range exceeds 10% of the nominal wavelength (150 nm for this case). Above a 10% tuning range, the bias current increases dramatically, typically exceeding 10 kA/cm$^2$. However, for a long lifetime operation, quantum well lasers used in tunable lasers are commonly operated with a maximum current density corresponding to about a 70 nm tuning range. As can be seen in plot 2380 a quantum dot active region of the present invention may be tuned to greater than 150 nm (e.g., greater than 200 nm) with current densities in the 2–3 kA/cm² range. This permits, for example, a single quantum dot laser to be used to achieve a tuning range of 180 nanometers at a current density of less than about 3 kA/cm² which is impractical with conventional quantum well lasers.

Figure 24:
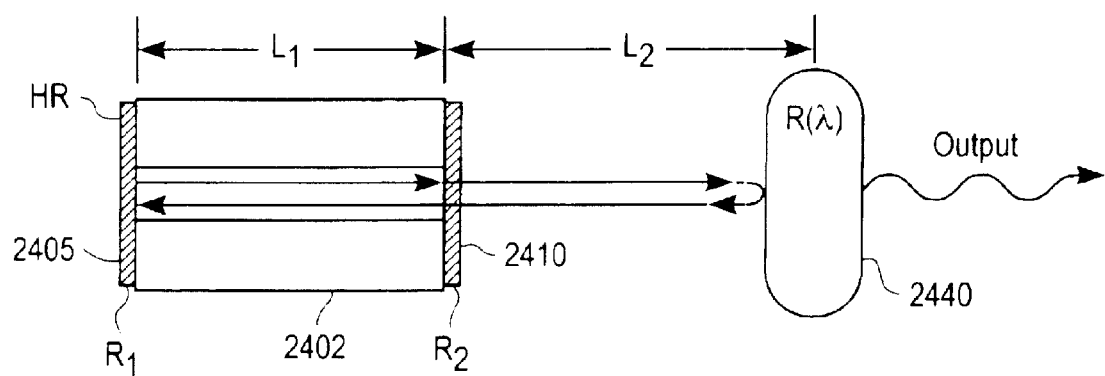
FIG. 24 is a block diagram of a generic external cavity laser structure.

A quantum dot laser of the present invention may be used as the active gain medium of a tunable external cavity laser. FIG. 24 is a top view of a generic external cavity laser. The threshold condition for lasing is that the summation of the resonator losses (mirror and internal losses) is balanced by the optical gain of the gain medium. In a tunable laser, a wavelength selector 2440 is included that has a reflectivity that is a function of wavelength. Typically a rear facet 2405 of a laser diode 2402 retains a high reflectivity whereas a front facet 2410 is processed to have an extremely low reflectivity. The threshold condition for the external cavity system is: $R_1 e^{2(g-\alpha i)L1} R(\lambda) e^{(-2\alpha e L2)} = 1$, where R1 is the reflectivity of the rear facet of the laser diode, g is the gain per unit length of the laser diode, $\alpha i$ is the loss per unit length of the laser diode, L1 the cavity length of the laser diode, $R(\lambda)$ the reflectivity of the wavelength selector, $\alpha e$ is the average loss per unit length of the external cavity, and L2 is the effective length of the external cavity.

Figure 25A:
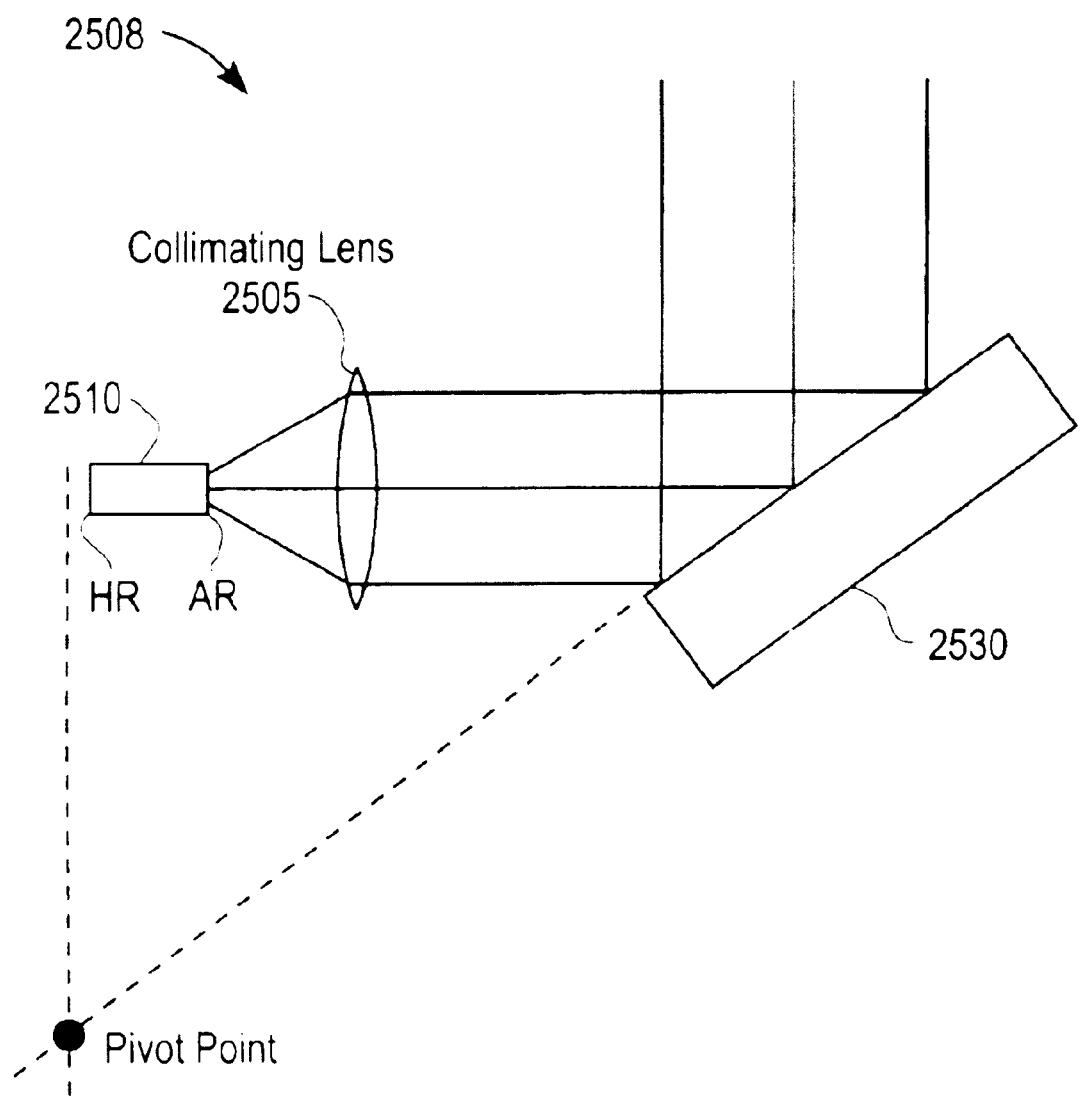
FIGS. 25A and 25B are block diagrams illustrating two external cavity laser arrangements.
Figure 25B:
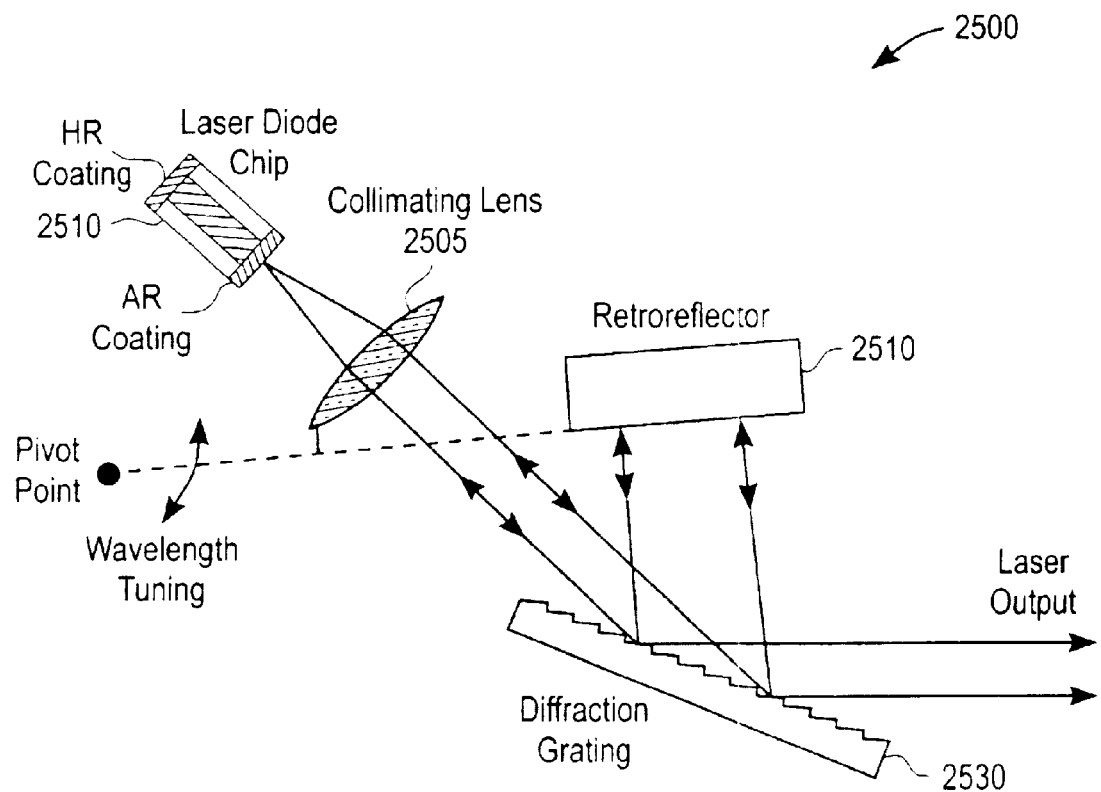

In an external cavity tunable laser, the wavelength selector may be any combination of external elements whose transmissivity or reflectivity response as a function of wavelength may be controlled such as to limit the optical feedback to the laser to a narrow wavelength band. Tunable external cavity lasers typically use an external grating arranged to provide wavelength-selective optical feedback based on wavelength-selective dispersion. Referring to FIGS. 25A and 25B, in an external cavity semiconductor laser typically one facet of a laser diode is coated with a high reflectivity (HR) material and the other facet is coated with an antireflection (AR) coating. An external grating is typically arranged to provide wavelength selective feedback back to the laser diode and to also serve as an output coupler. The reflectivity of the AR coating and the length of the laser cavity are preferably selected to suppress Fabry-Perot (FP) modes in the laser. It will also be understood that any known technique to suppress Fabry-Perot modes from the cleaved facets over a range of wavelength may also be used, such as incorporating unguided window regions or tilting the laser stripe with respect to the facet during device fabrication. The length of the semiconductor laser and residual reflectivity of the AR coated facet is preferably selected such that the external grating solely determines the lasing wavelength. In one embodiment, the length of the semiconductor laser and the residual reflectivity of the AR coated facet is selected so that the laser is incapable of lasing off the ground state and at least the first excited state of the quantum dots without feedback from the external grating.

In an external cavity laser, the minimum gain must exceed the cavity losses. Thus, referring back to FIG. 24, to achieve a wide tuning range the saturated laser gain for the ground state should be selected to be greater than the total resonator losses, which include the absorption losses and mirror losses. However, the grating selected wavelength only depletes the optical gain within the homogenous gain broadening range such that the grating selected wavelength only suppress the Fabry-Perot mode only within approximately 20 nm of the free-run emission wavelength. Consequently, in one embodiment, the peak gain at high quantum states, $g_p$, is preferably selected to be sufficiently low to prevent deleterious lasing from FP modes due to residual facet reflectivity of the front facet.

Two common external cavity configuration are the Littman-Metcalf external cavity and the Littrow external cavity. FIG. 25B is an illustration of a Littman-Metcalf laser cavity. FIG. 25A is an illustration of a Littrow laser cavity 2508. In the Littrow cavity the angle of incidence of the light received by the grating 2530 from the laser 2510 is such that the beam is reflected back to the laser serving the function of one mirror of the laser cavity. The angle of the grating determines the wavelength. An etalon is sometimes included in a Littrow configuration to decrease the cavity bandwidth. In the Littman-Metcalf configuration 2500, the grating 2530 diffracts the light towards a tuning mirror 2510 (also known as a retroreflector), which determines the feedback. Collimating lenses 2505 are typically included in an external cavity laser to improve the coupling of the laser output to the grating.

One application of a tunable laser in accord with the present invention is for testing & monitoring (T&M) applications. A practical tunable laser for T&M applications must have a maximum operating current selected to achieve a reasonable laser lifetime (e.g., a current density of greater than 10 kA/cm² is typically correlated with a degraded lifetime). In commercially available tunable lasers using quantum well gain medium the quantum well lasers have useful wavelength range of about 70 nanometers. However, in many applications it is desirable to have a larger tuning range. Conventionally, three tunable lasers, each having quantum well gain media optimized for different wavelength ranges, would be required for T&M over a 200 nanometer tuning range. By way of contrast, the quantum dot lasers of the present invention have a continuous tuning range of at least 200 nanometers at practical current densities.

Figure 26:
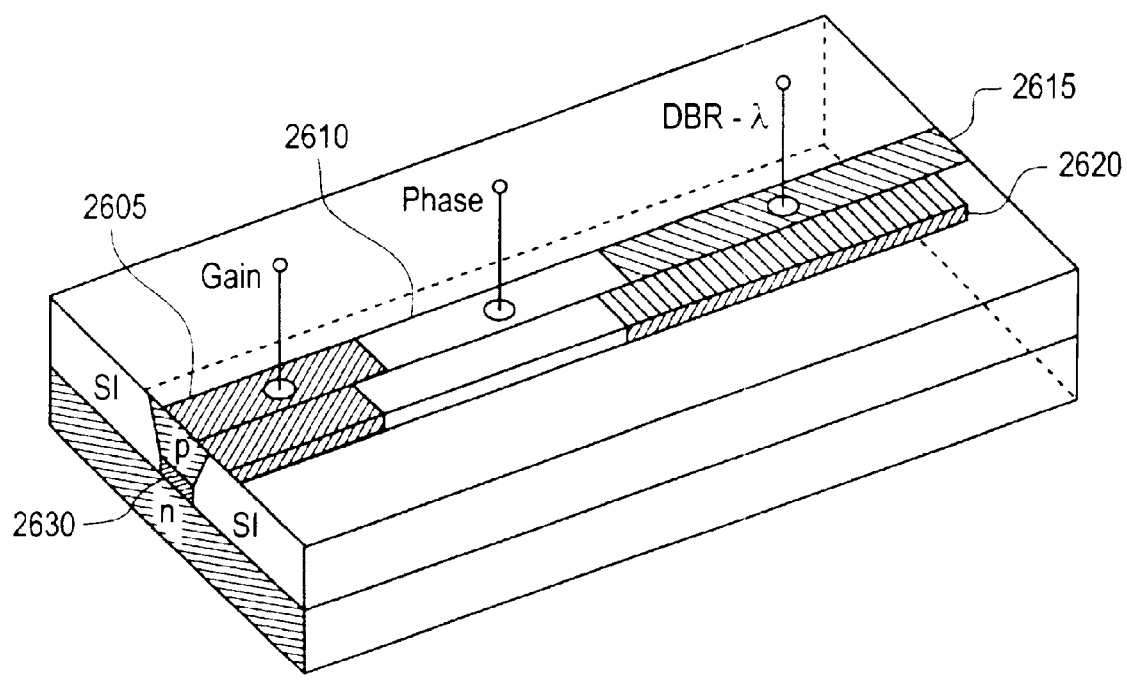
FIG. 26 is a perspective view of tunable laser.

It will be also be understood that the quantum dot active regions of the present invention may be used in laser structures having an integrated wavelength selector element to tune the lasing wavelength. A variety of other semiconductor laser structure with wavelength selector elements are known in the art. In particular, a variety of tunable distributed Bragg reflector (DBR) and distributed feedback laser structures (DFB) are known in the lasing art. DFB and DBR lasers include a grating that define a Bragg wavelength condition given by $\lambda_m = 2n\Lambda/m$, where $\Lambda$ is the grating period, n is the refractive index of the material, and m is the diffraction order. The Bragg wavelength condition defines a wavelength having a high effective reflectivity associated with the grating. As shown in FIG. 26, multi-section DFB and DBR lasers are known in the art having a plurality of sections 2605, 2610, 2615 in which a current may be adjusted in one section of the laser to adjust the refractive index of a portion of the grating 2620 of the laser and hence its Bragg wavelength. A suitable tunable DFB or DBR laser may be modified to include a quantum dot active region 2630 of the present invention.

Figure 27A:
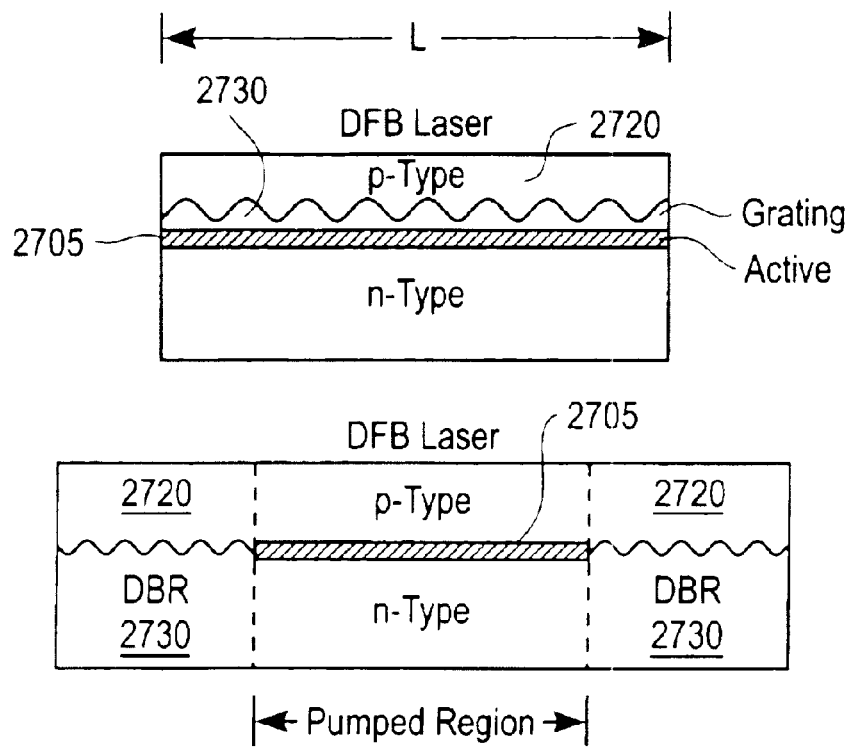
FIG. 27A shows single wavelength laser structure with Bragg gratings.
Figure 27B:
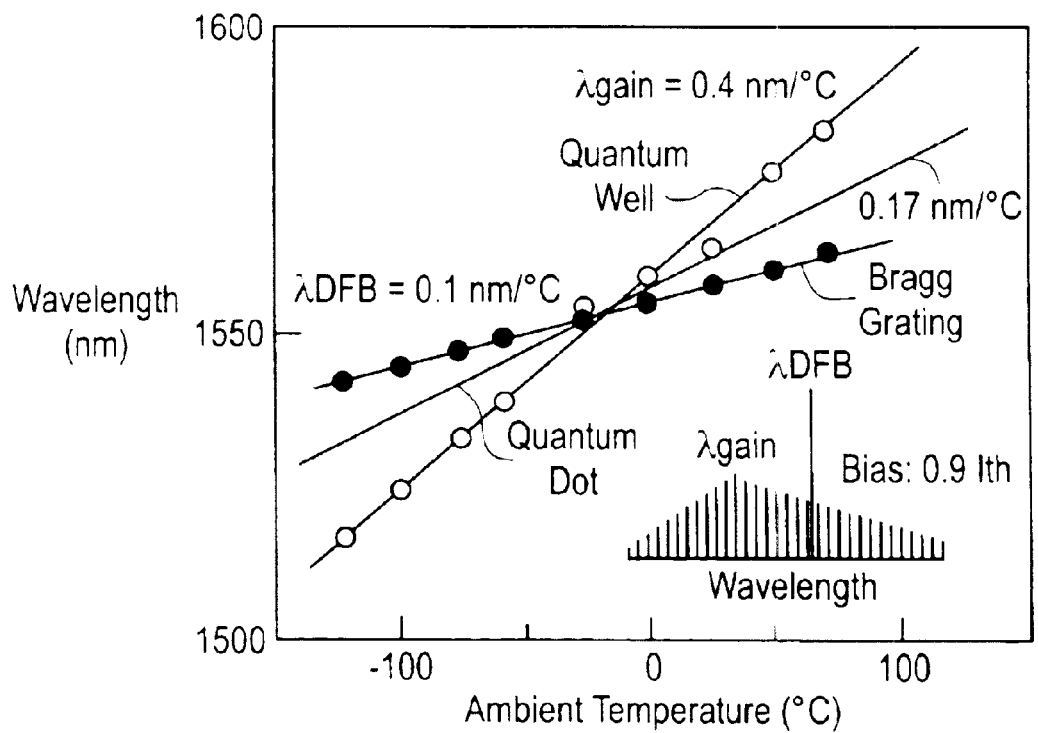
FIG. 27B shows a comparison of wavelength response versus temperature for conventional quantum well active regions and quantum dot active regions compared with the wavelength response of a Bragg grating.

Additionally, the output wavelength of a semiconductor laser having a quantum dot active region may be temperature tuned. Referring to FIG. 27A, a distributed feedback laser having a quantum dot active region 2705 may include any suitable grating structure to establish a Bragg lasing condition from the periodicity of a grating fabricated on waveguide layers 2720, 2730 having different refractive indices. In a conventional DFB laser, thermal expansion and the temperature dependence of the refractive index causes a shift in the Bragg wavelength of about 0.1 nm/° C. In conventional 1.3 micron lasers the gain peak shifts by about 0.4° C. The result is that there is a limited temperature range (e.g., typically about 40° C.) over which the DFB laser retains good modal properties, i.e., the DFB laser tends to have too high a threshold current or has poor mode discrimination if the temperature rises such that the gain peak is substantially longer in wavelength than the Bragg wavelength. FIG. 27B shows the shift in Bragg wavelength and gain peak versus temperature for conventional 1.3 micron lasers. Quantum dot active regions have a delta function density of states associated with the three dimensional quantum confinement of the quantum dots that results in reduced temperature sensitivity. Experiments by the inventors indicated that quantum dots have a measured shift in peak gain of only about 0.17 nm/° C. due to the delta function density of states associated with the three dimensional quantum confinement. The reduced temperature sensitivity of the gain peak along with the broad gain function permits a temperature tuned DFB quantum dot laser to achieve an increased tuning range compared to a conventional bulk or quantum well DFB laser. In one embodiment of a DFB laser, the Bragg wavelength is selected to operate on the long wavelength side of the optical gain spectrum at a first operating temperature to facilitate operating the laser at higher operating temperatures (which shifts the optical gain spectrum to longer wavelengths).

Figure 28:
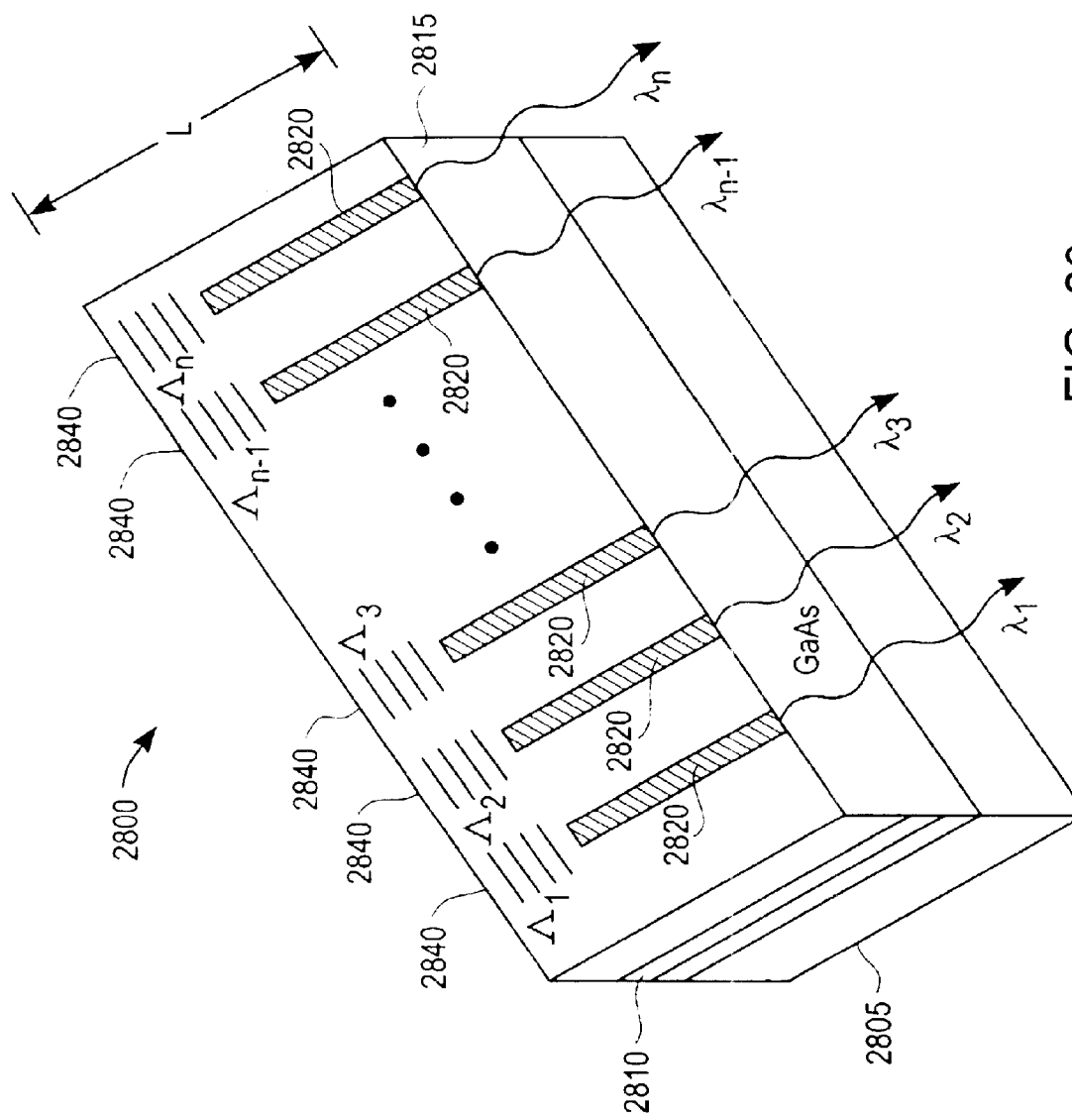
FIG. 28 shows a multi-wavelength array of lasers having a quantum dot active region.

The quantum dot active region of the present invention may also be used in monolithic multi-wavelength arrays of lasers. FIG. 28 is a perspective view of a multiwavelength array 2800 of lasers 2820. Each laser 2820 may be fabricated as a ridge laser, buried heterostructure laser, or other laser structure providing lateral optical confinement. Each laser has a longitudinal cavity length, L. A conventional cleaving or etching process may be used to form a laser facet 2815. The array 2800 is formed on a common substrate 2805 having a quantum dot active region 2810. The growth parameters of the quantum dot active region 2810 are selected to achieve a desired wavelength tuning range (e.g., 100 to 200 nm) within a desired range of current densities. Each laser is preferably a DFB or DBR laser having at least one grating section 2830 with the grating periodicity, Λ, of its grating selected to achieve a desired wavelength of the laser. One benefit of the monolithic multi-wavelength array 2800 is that the large tuning range of the quantum dot active region 2810 permits DFB or DBR lasers 2820 having a large number of different output wavelengths to be simultaneously fabricated for dense wavelength division multiplexed (DWDM) applications. Alternately, array 2800 may be used for wide wavelength division multiplexed (WWDM) applications in which it is desirable to have a smaller number of wavelengths but with a significant wavelength spacing. For example, in one embodiment, array 2800 could be used to cover the wavelength range of 1270 nanometers to 1355 nanometers (e.g., a 75–85 nanometer range). In one embodiment the inhomogeneous broadening and the difference in energy of the ground state transition energy and the first excited state transition energy is selected to permit a continuous optical gain spectrum of at least 75 nanometers for a maximum threshold current density.

The optical characteristics of the quantum dot active region 2810 of array 2800 also permits each laser to be directly modulated at high data rates. Theoretical investigations by the inventors indicate that optimized quantum dot lasers should have a linewidth enhancement factor that is approximately a factor of five-to-ten lower than for conventional quantum well lasers along with a higher differential gain. This makes it practical to directly modulate quantum dot lasers at high data rates (e.g., 10–40 Gbit/s) with acceptable chirp. This is in contrast to conventional quantum well lasers, which are typically modulated with external modulator at high data rates to reduce chirping effects. Additionally, the low threshold current density of the quantum dot lasers of the present invention facilitate direct laser modulation. Typically, directly modulated high-frequency lasers require drive currents that are several times the threshold current. The comparatively low threshold current of each laser of multiwavelength array 2800 facilitates direct modulation at high data rates. Consequently, in one embodiment, each laser of the multiwavelength array is directly modulated by varying its drive current. This eliminates the needs for external modulators, filters, and optical isolators used in conventional DWDM systems.

Figure 29:
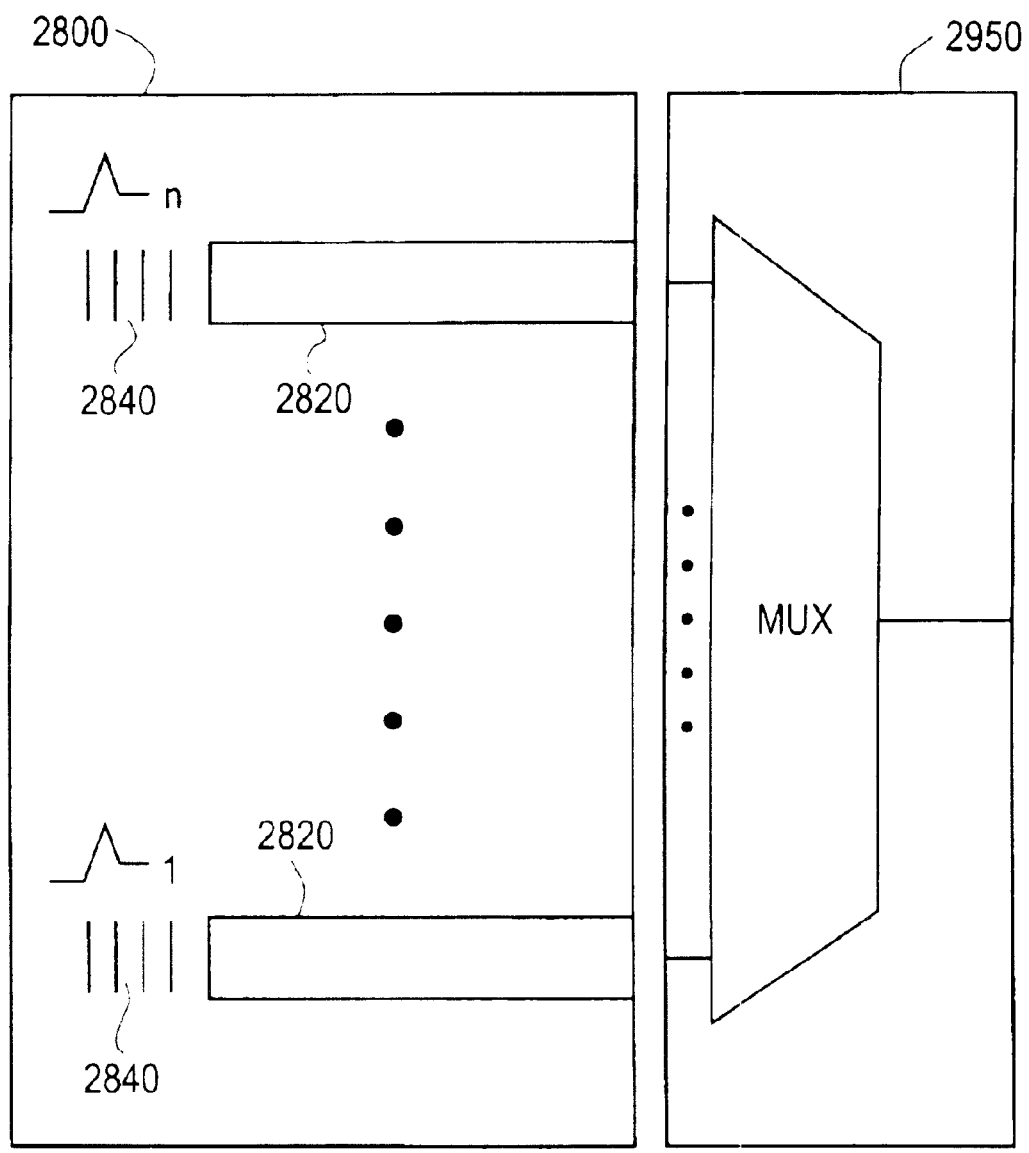
FIG. 29 is a block diagram illustrating an embodiment in which the multi-wavelength array of FIG. 28 is coupled by an optical multiplexer to an optical fiber.

As shown in FIG. 29, if each laser of the array is directly modulated their outputs may be directly received by an optical combiner (MUX) 2950 module and coupled to an optical fiber. It will be understood that in a direct current modulation embodiment that any suitable high frequency packaging technique may be used to facilitate coupling microwave frequency drive currents to each laser. In one embodiment, each laser is driven by a wire bond. However, a wire bond has a parasitic inductance such that long lengths of bonding wire may degrade performance at very high data rates. In another embodiment, microwave transmission lines are fabricated on array 2900 to facilitate coupling microwave drive current to each laser. In still another embodiment, array 2900 is mounted on a submount adapted to provide microwave current to each laser.

Figure 30:
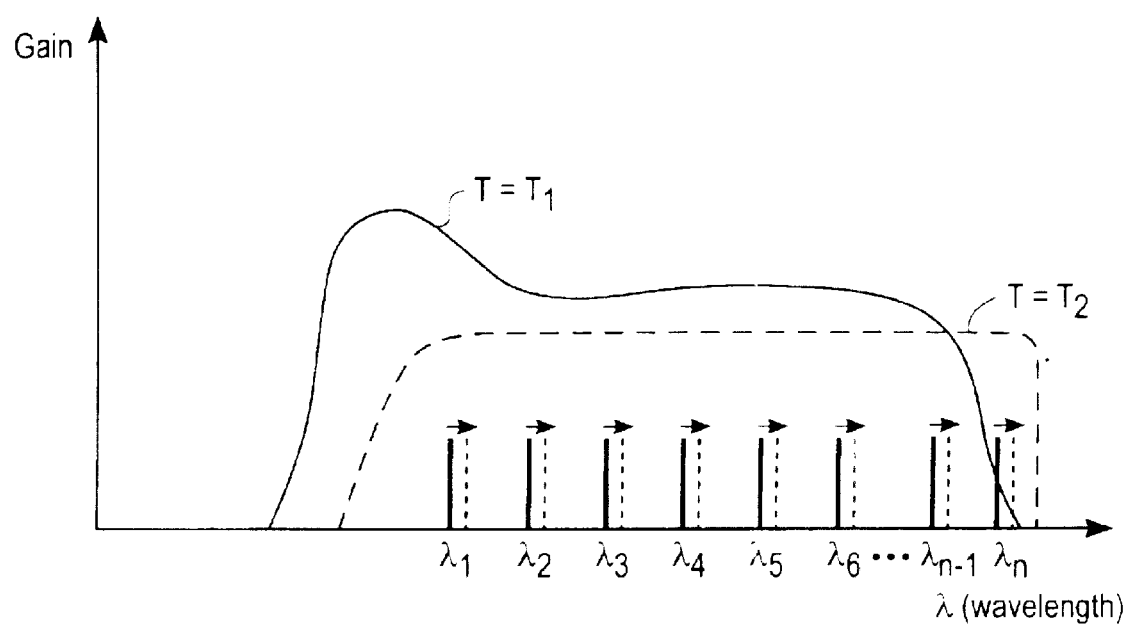
FIG. 30 shows plots of optical gain spectrum for an array at two different operating temperature with corresponding DFB wavelengths superimposed.

One benefit of a multiwavelength array 2800 of the present invention is that temperature tuning may be used to fine-tune the wavelength of a large number of wavelengths. FIG. 30 illustrates a gain spectrum for two different temperature with Bragg wavelengths of an array of lasers (having a "picket" fence shape for an optical network grid) superimposed on the same plot. Referring to FIG. 30, in one embodiment, the nominal DFB wavelengths at a first temperature, $T_1$, are selected to cover an upper wavelength range of the gain spectrum. Tuning the temperature of array 2800 to a higher temperature $T_2$ shifts the gain spectrum at a slightly higher rate than the Bragg wavelengths. Due to the large initial width of the gain curve and the reduced temperature shift of the gain response of quantum dot lasers, a monolithic array of DFB lasers spanning a large wavelength range can be simultaneously tuned over a wide range.

Another benefit of array 280 is that the low threshold current density and slow drift of the gain response with temperature renders the lasers less susceptible to heating and thermal cross-talk. This may permit, for example, individual lasers to be more closely packed (e.g., a small inter-laser separation) compared with conventional quantum well lasers. Additionally, the thermal characteristics of array 2800 may facilitate operating the array junction up, i.e., with the substrate mounted to a heat sink. As is well known in the laser art, a junction down configuration (epitaxial layer mounted to the heat sink) has less thermal resistance but typically increased the packaging complexity and cost. Still another benefit of array 2800 is that for some applications, such as WWDM, the need for the heat sink to be cooled may be eliminated.

While embodiments of the present invention have been discussed in detail in regards to quantum dot layers comprising InAs embedded in InGaAs quantum wells, it will be understood that invention may be practices in related III–V compound semiconductor materials. For example, the InGaAs quantum wells may be replaced with AlInGaAs wells. Similarly, the barrier layers may comprise a variety of III–V materials, such as AlGaAs or AlGaInAsP. It will be understood, that the barrier layers may be comprised of a material having a lattice constant selected so that the barrier layers between quantum dot layers serve as strain compensation layers.

The present invention has been discussed in detail in regards to laser structures grown on GaAs substrates. GaAs substrates have many advantages over other III–V semiconductor substrates, such as a comparatively large wafer size. However, while the present invention has been discussed in regards to materials formed on a GaAs substrate, it will be understood that embodiments of the present invention may be practiced on other types of substrates, such as InP substrates. Additionally, while molecular beam epitaxy has been described as a preferred fabrication technique, it will be understood that embodiments of the present invention may be practiced using other epitaxial techniques as well.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A semiconductor laser, comprising:
   a semiconductor optical waveguide;
   quantum dot means optically coupled to the optical waveguide having an ensemble of quantum dots for providing a saturated ground state modal gain of greater than about 25 cm$^{-1}$ at an emission wavelength of at least about 1260 nm responsive to an injected current; and
   quantum well means for providing carrier confinement of injected current to the quantum dot means.

2. The laser of claim 1, wherein the laser has a cavity length not greater than 500 microns.

3. A directly modulated laser, comprising:
   a semiconductor optical waveguide;
   quantum dot means optically coupled to the optical waveguide having an ensemble of quantum dots for providing a saturated ground state modal gain of greater than about 25 cm$^{-1}$ at an emission wavelength of at least about 1260 nm responsive to an injected current, the quantum dot means having a linewidth enhancement factor of less than about 0.2;
   means for injecting a modulated current into the quantum dot means to vary the light output of the laser; and
   quantum well means for providing carrier confinement of injected current to the quantum dot means.

4. The laser of claim 3, wherein the laser has a cavity length not greater than 500 microns.

5. The laser of claim 3, wherein the laser has a cavity length not greater than 300 microns.

6. A semiconductor laser, comprising:
   a semiconductor optical waveguide;
   quantum dot means optically coupled to the optical waveguide having an ensemble of quantum dots with a sequence of at least two inhomogeneously broadened optical transition energies for providing a continuous optical gain spectrum over a wavelength range of greater than 75 nanometers responsive to a threshold drive current; and
   quantum well means for providing carrier confinement of injected current to the quantum dot means.

7. A semiconductor laser, comprising:
   a semiconductor optical waveguide;
   quantum dot means optically coupled to the optical waveguide having an ensemble of quantum dots with a sequence of at least three inhomogeneously broadened optical transition energies for providing a continuous optical gain spectrum over a wavelength range of greater than 150 nanometers responsive to a threshold drive current; and
   quantum well means for providing carrier confinement of injected current to the quantum dot means.

8. A semiconductor laser, comprising:
   a semiconductor optical waveguide including a plurality of spaced-apart quantum wells within an active region disposed within the waveguide; and
   a plurality of quantum dots embedded in the plurality of spaced-apart quantum wells, the quantum dots shaped and positioned within each quantum well to provide a saturated ground state modal gain to the waveguide of greater than about 25 cm$^{-1}$ at an emission wavelength of at least about 1260 nm responsive to an injected current.

9. The laser of claim 8, wherein the laser has a saturated ground state modal gain of at least 40 cm$^{-1}$.

10. The laser of claim 8, wherein there are between four to eight quantum wells layers and the active region has a thickness of not more than 300 nanometers.

11. The laser of claim 10, wherein the thickness of the active region is in the range of between 200 nanometers to 300 nanometers.

12. The laser of claim 8, wherein a barrier layer thickness between neighboring quantum wells is greater than 20 nanometers.

13. A semiconductor laser, comprising:
    a semiconductor optical waveguide formed on a GaAs substrate including a plurality of spaced-apart quantum wells within an active region disposed in the waveguide; and
    a plurality of quantum dots embedded in the plurality of spaced-apart quantum wells, the quantum dots having a size distribution forming a sequence of at least three inhomogeneously broadened optical transition energies for providing a continuous optical gain spectrum over a wavelength range of greater than 150 nanometers responsive to a threshold drive current.

14. A semiconductor laser, comprising:
    a semiconductor optical waveguide including a plurality of spaced-apart quantum wells within an active region disposed in the waveguide; and
    a plurality of quantum dots embedded in the plurality of spaced-apart quantum wells, the quantum dots having a size distribution forming a sequence of at least two inhomogeneously broadened optical transition energies for providing a continuous optical gain spectrum over a wavelength range of at least 75 nanometers responsive to a threshold drive current.

15. A semiconductor active region for providing optical gain, comprising:
    an InGaAs quantum well semiconductor quantum well having a substantially planer well layer sandwiched between first and second barrier layers; and a plurality of InAs quantum dots embedded in the IuGaAs quantum well;

the quantum dots sized to have a ground state emission energy at room temperature of at least 1260 nanometers.

16. A semiconductor active region for providing optical gain, comprising: an InGaAs quantum well semiconductor quantum well having a substantially planar well layer sandwiched between first and second barrier layers;

a plurality of InAs quantum dots embedded in the InGaAs quantum well, the quantum dots having a ground state with an associated first optical transition energy value and a first excited state having an associated second optical transition energy value, the second optical transition energy value being in the range of between 30 meV to 80 meV greater than the first optical transition energy value; and p-type and n-type diode layers positioned to inject current into the quantum dots;

the quantum dots having an inhomogenous broadening associated with size variations of the quantum dots sufficient with respect to the energy separation of the optical transition energies for the quantum dots to have a continuous optical gain spectrum responsive to a threshold electrical current density.

* * * * *

UNITED STATES PATENT AND TRADEMARK OFFICE
CERTIFICATE OF CORRECTION

PATENT NO. : 6,816,525 B2
DATED : November 9, 2004
INVENTOR(S) : Andreas Stintz et al.

It is certified that error appears in the above-identified patent and that said Letters Patent is hereby corrected as shown below:

<u>Column 24,</u>
Line 66, please replace "planer" with -- planar --.

<u>Column 25,</u>
Line 1, please replace "IuGaAs" with -- InGaAs --.

Signed and Sealed this

Twenty-fifth Day of January, 2005

JON W. DUDAS
*Director of the United States Patent and Trademark Office*